United States Patent
Yamagami et al.

(10) Patent No.: US 12,471,266 B2
(45) Date of Patent: Nov. 11, 2025

(54) TWO PORT SRAM DEVICE USING FORKED NANOSHEET FETS

(71) Applicant: Socionext Inc., Kanagawa (JP)

(72) Inventors: Yoshinobu Yamagami, Yokohama (JP); Shinichi Moriwaki, Yokohama (JP)

(73) Assignee: SOCIONEXT INC., Kanagawa (JP)

( * ) Notice: Subject to any disclaimer, the term of this patent is extended or adjusted under 35 U.S.C. 154(b) by 642 days.

(21) Appl. No.: 17/872,810

(22) Filed: Jul. 25, 2022

(65) Prior Publication Data

US 2022/0359541 A1 Nov. 10, 2022

Related U.S. Application Data

(63) Continuation of application No. PCT/JP2021/000097, filed on Jan. 5, 2021.

(30) Foreign Application Priority Data

Jan. 27, 2020 (JP) .................................. 2020-010882

(51) Int. Cl.
H10B 10/00 (2023.01)
H10D 30/00 (2025.01)

(52) U.S. Cl.
CPC ......... *H10B 10/125* (2023.02); *H10D 30/501* (2025.01); *H10D 30/502* (2025.01)

(58) Field of Classification Search
CPC .... H10B 10/125; H10D 30/501; H10D 30/50; H10D 30/43; H10D 30/47; H10D 30/62;

(Continued)

(56) References Cited

U.S. PATENT DOCUMENTS 8,913,455 B1 * 12/2014 Camarota .......... H10D 84/0165
365/189.04
9,646,973 B2   5/2017 Liaw (Continued)

FOREIGN PATENT DOCUMENTS

JP   2013-026594 A   2/2013
JP   2018-026565 A   2/2018

(Continued)

OTHER PUBLICATIONS

P. Weckx et al., "Novel forksheet device architecture as ultimate logic scaling device towards 2nm," 2019 IEEE International Electron Devices Meeting (IEDM), San Francisco, CA, USA, 2019, pp. 36.5.1-36.5.4, doi: 10.1109/IEDM19573.2019.8993635. (Year: 2019).*

(Continued)

*Primary Examiner* — Eliseo Ramos Feliciano
*Assistant Examiner* — Brad A Knudson
(74) *Attorney, Agent, or Firm* — Rimon P.C.

(57) ABSTRACT

A semiconductor storage device including a two-port SRAM cell, in which nanosheets 21 to 24 are formed in line in this order in the X direction, and nanosheets 25 to 28 are formed in line in this order in the X direction. Faces of the nanosheets 21, 23, 25, and 27 on the first side in the X direction are exposed from gate interconnects 30, 33, 35, and 36, respectively. Faces of the nanosheets 22, 24, 26, and 28 on the second side in the X direction are exposed from gate interconnects 33, 34, 36, and 39, respectively.

12 Claims, 18 Drawing Sheets

(58) Field of Classification Search
CPC ............ H10D 30/673; H10D 30/6748; H10D 30/6757
See application file for complete search history.

(56) References Cited

U.S. PATENT DOCUMENTS

| | | | |
|---|---|---|---|
| 9,646,974 B1* | 5/2017 | Liaw | ........................ H10D 89/10 |
| 2008/0197419 A1* | 8/2008 | Liaw | ........................ H10B 10/00 |
| | | | 257/401 |
| 2011/0222332 A1* | 9/2011 | Liaw | ........................ H10B 10/12 |
| | | | 365/156 |
| 2016/0284712 A1 | 9/2016 | Liaw | |
| 2017/0301664 A1* | 10/2017 | Yoshida | ................. H10B 10/12 |
| 2018/0026042 A1 | 1/2018 | Smith et al. | |
| 2018/0240802 A1 | 8/2018 | Smith et al. | |
| 2019/0326301 A1 | 10/2019 | Smith et al. | |
| 2019/0355712 A1 | 11/2019 | Yoshida et al. | |
| 2020/0006356 A1 | 1/2020 | Ando et al. | |
| 2021/0035986 A1* | 2/2021 | Yu | ........................... H10D 89/10 |

FOREIGN PATENT DOCUMENTS

| | | |
|---|---|---|
| WO | 2016/151866 A1 | 9/2016 |
| WO | 2019/108366 A1 | 6/2019 |

OTHER PUBLICATIONS

P. Weckx et al., "Stacked nanosheet fork architecture for SRAM design and device co-optimization toward 3nm," 2017 IEEE International Electron Devices Meeting (IEDM), San Francisco, CA, USA, 2017, pp. 20.5.1-20.5.4, doi: 10.1109/IEDM.2017.8268430. (Year: 2017).*

International Search Report (ISR) dated Apr. 6, 2021 issued in International Patent Application No. PCT/JP2021/000097 with partial English translation.

Written Opinion dated Apr. 6, 2021 issued in International Patent Application No. PCT/JP2021/000097 with partial English translation.

P. Weckx et al., "Stacked nanosheet fork architecture for SRAM design and device co-optimization toward 3nm", 2017 IEEE International Electron Devices Meeting (IEDM), Dec. 2017, IEDM17-505.

P. Weckx et al., "Novel forksheet device architecture as ultimate logic scaling device towards 2nm", 2019 IEEE International Electron Devices Meeting (IEDM), Dec. 2019, IEDM19-871~874.

Notice of Reasons for Refusal dated Dec. 17, 2024 issued in the corresponding Japanese Patent Application No. 2021-574572, with partial English translation.

\* cited by examiner

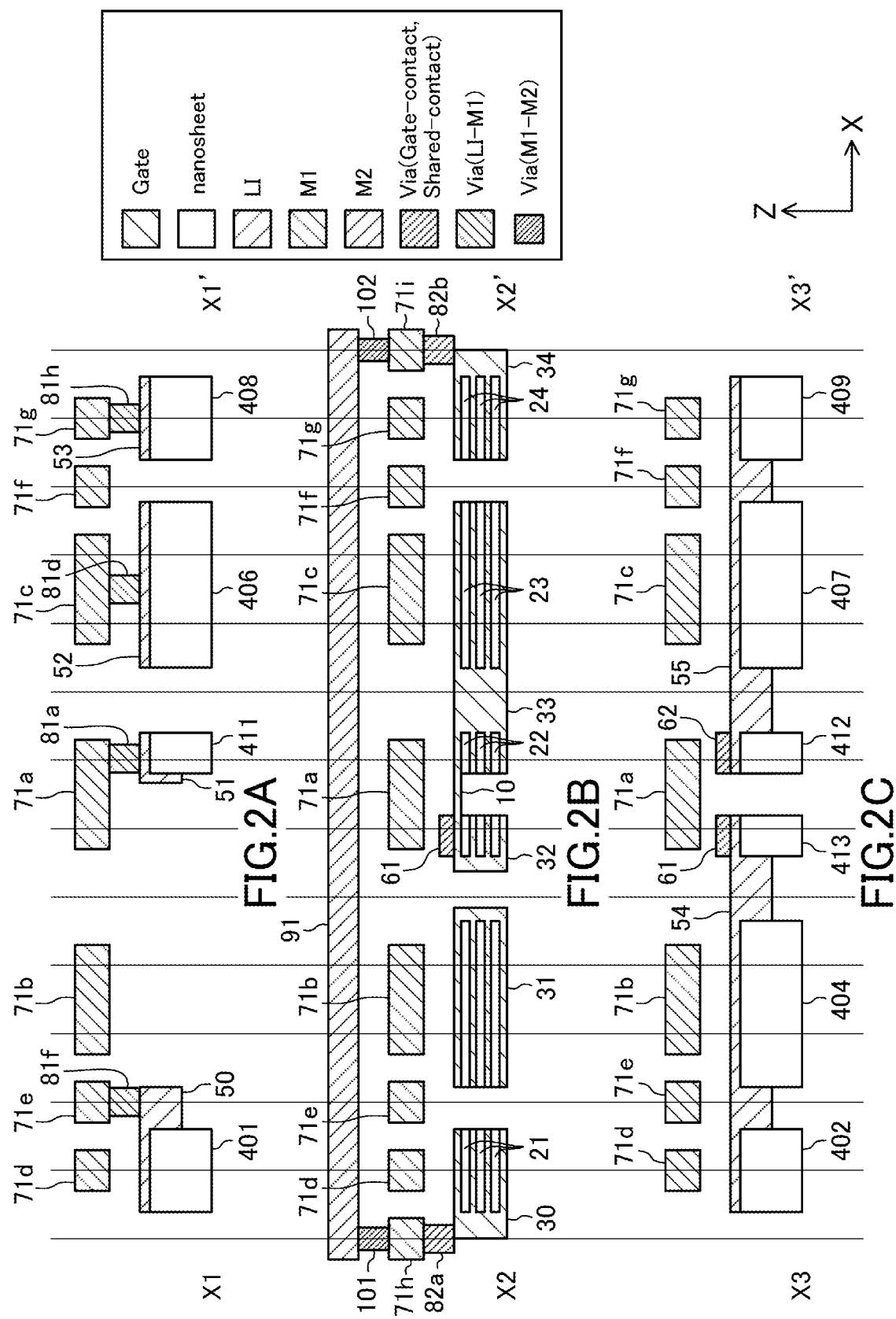

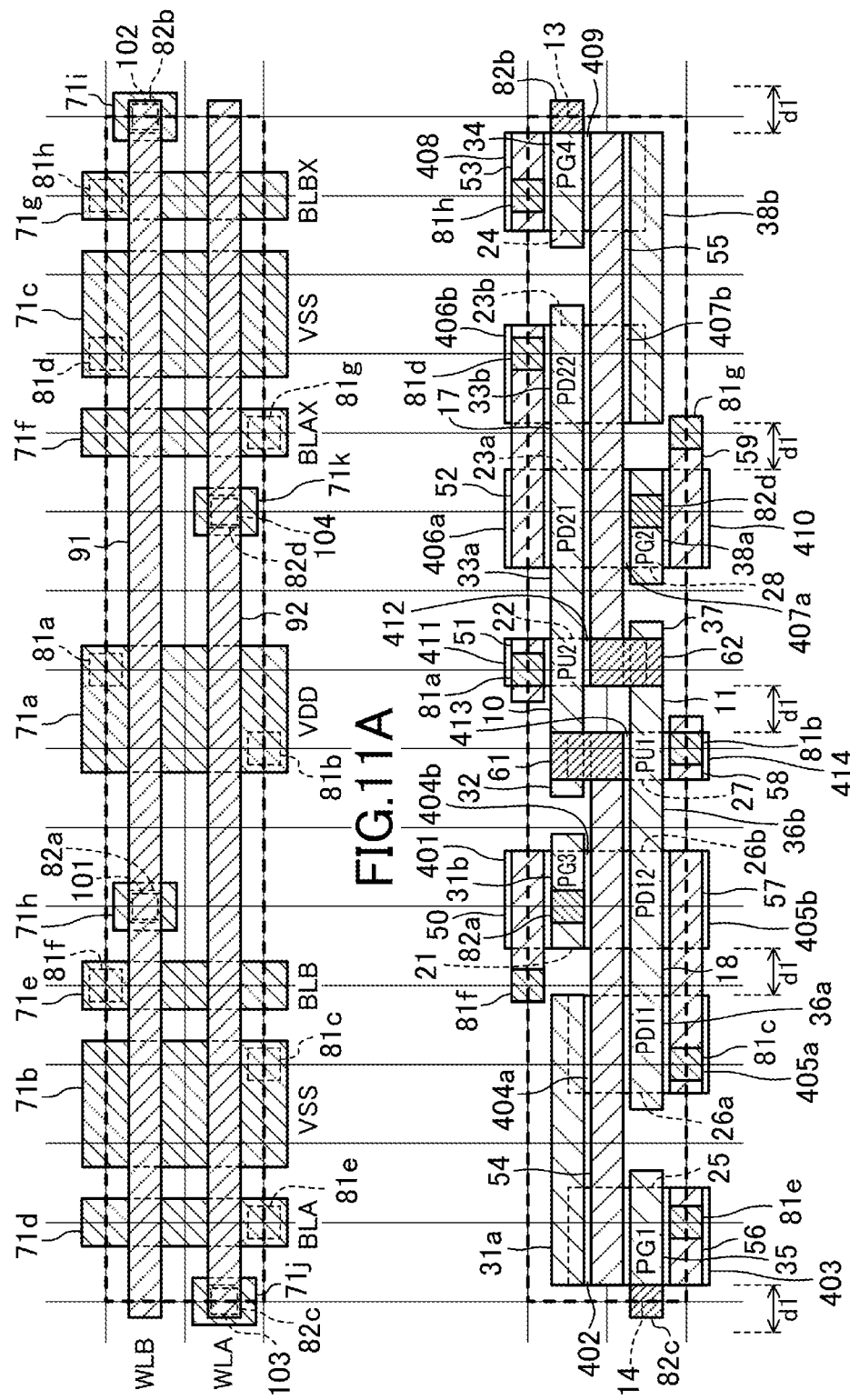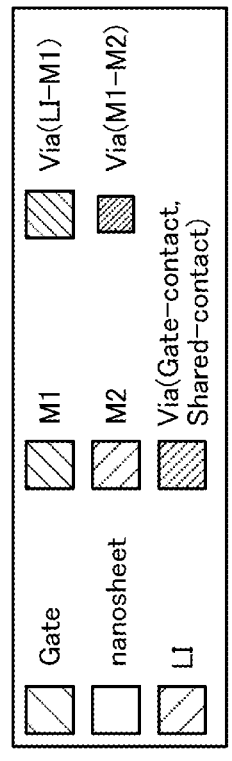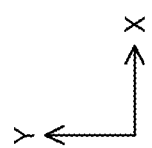
FIG.11A
FIG.11B

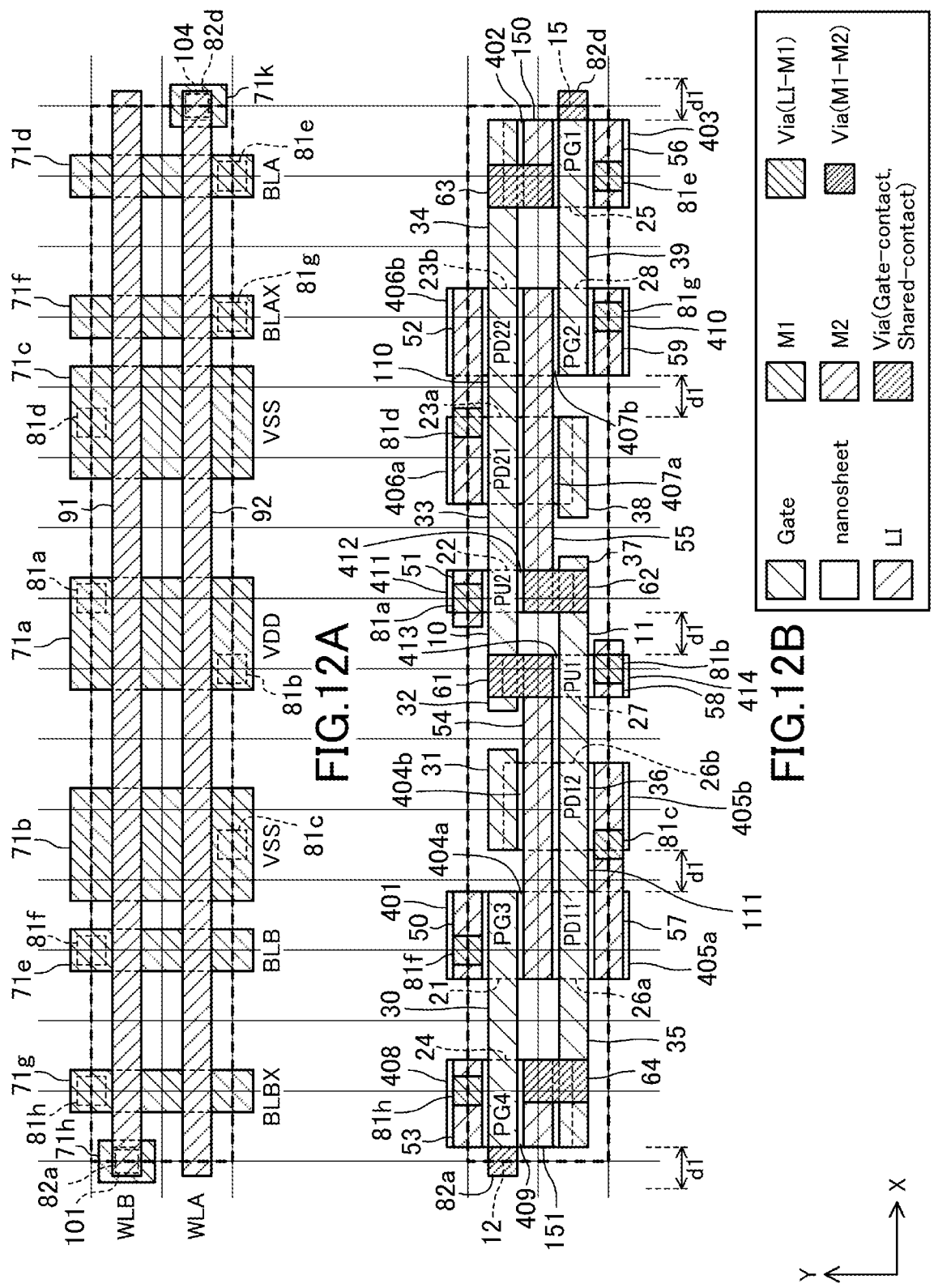

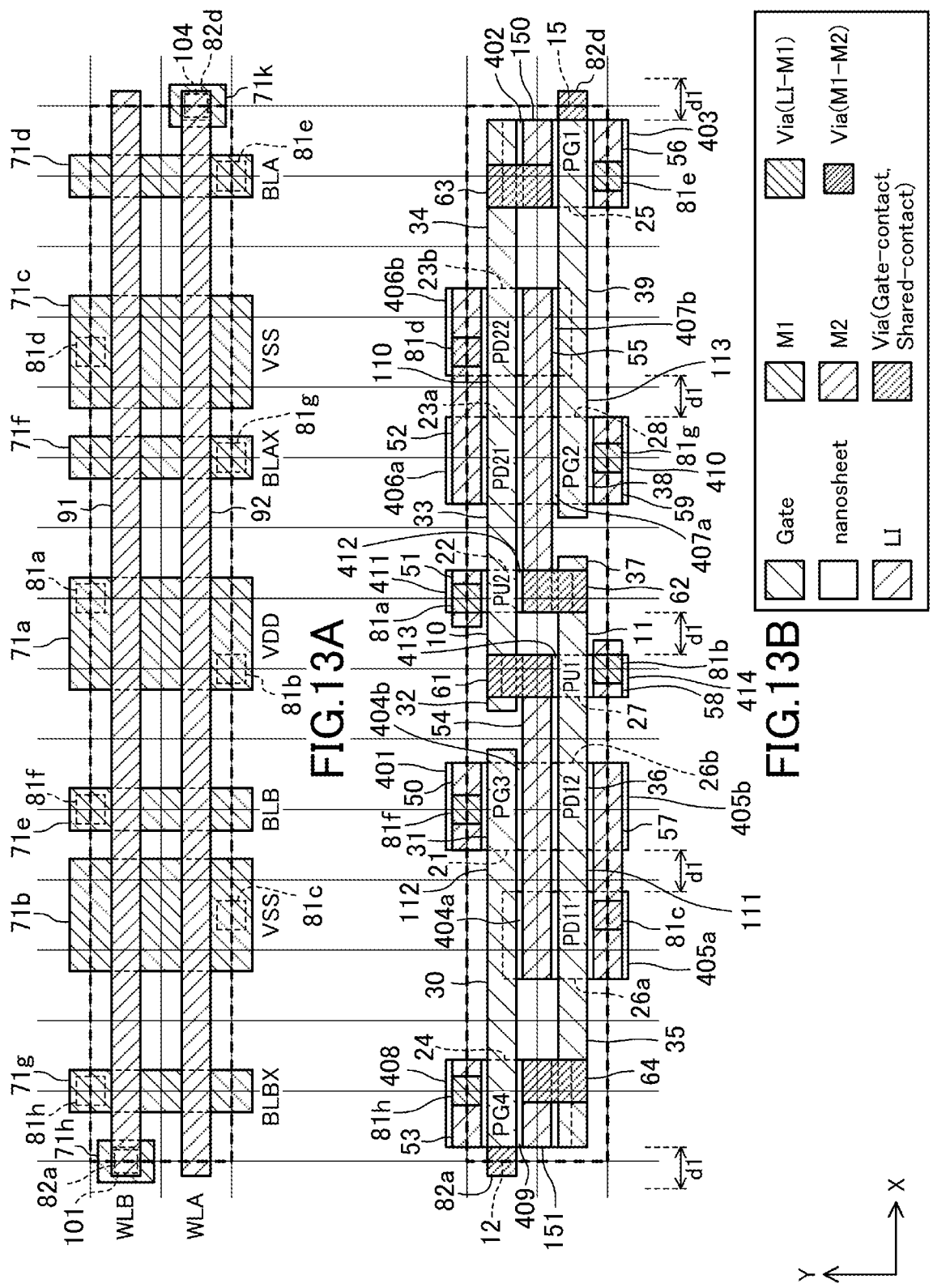

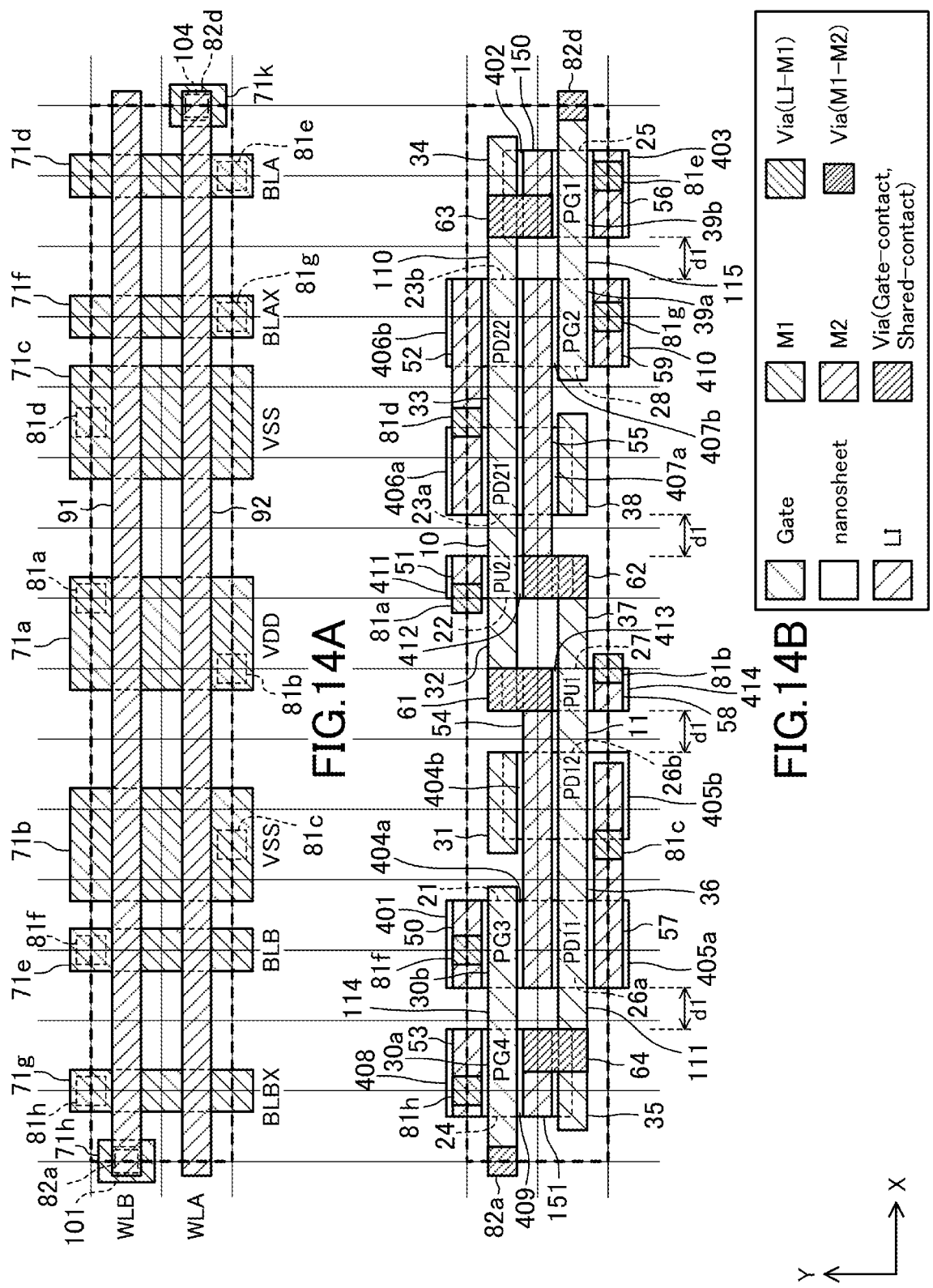

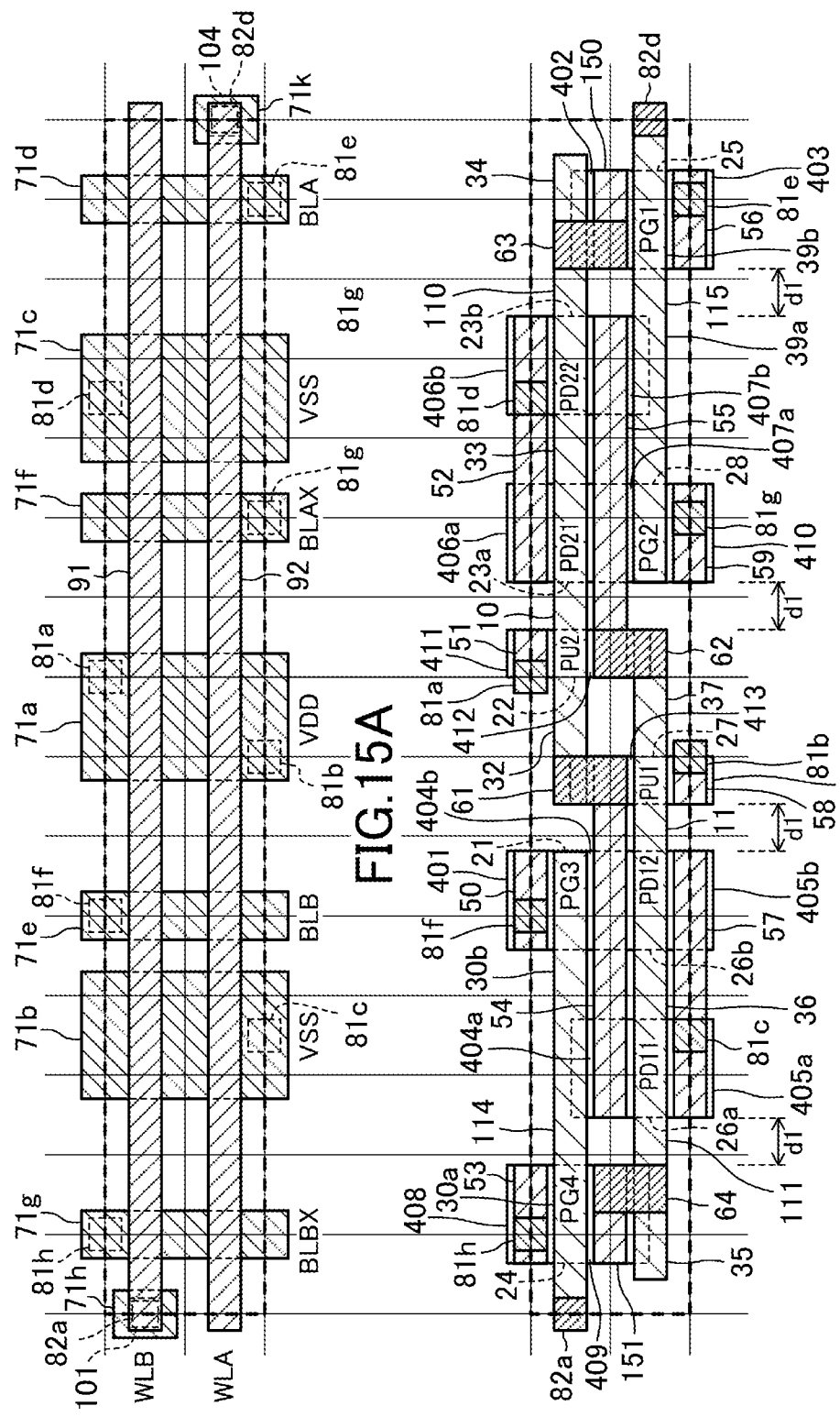
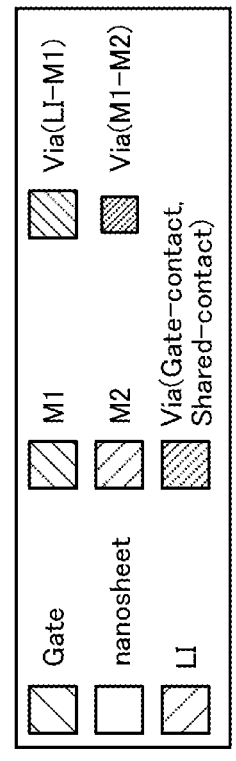
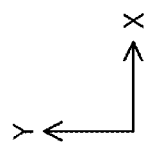
FIG.15A
FIG.15B

FIG.18A
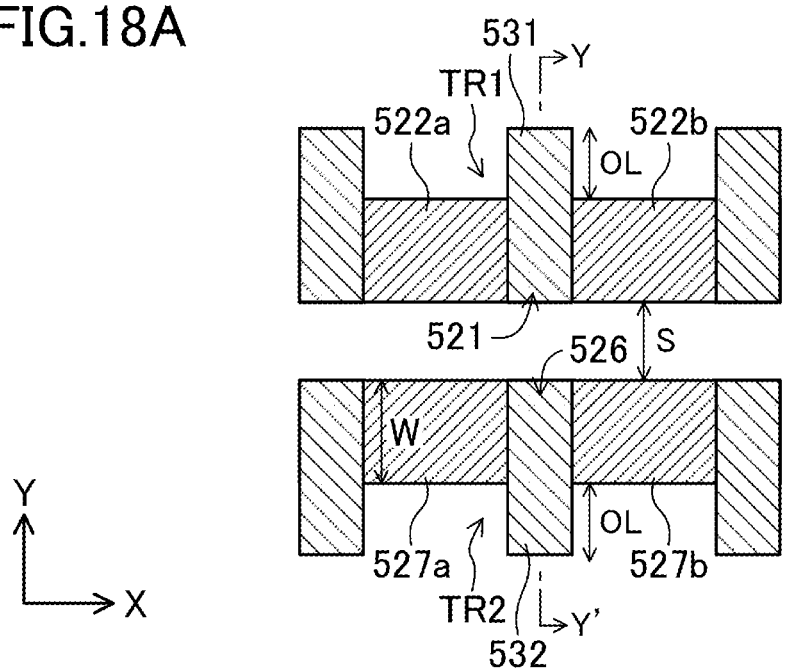
FIG.18B
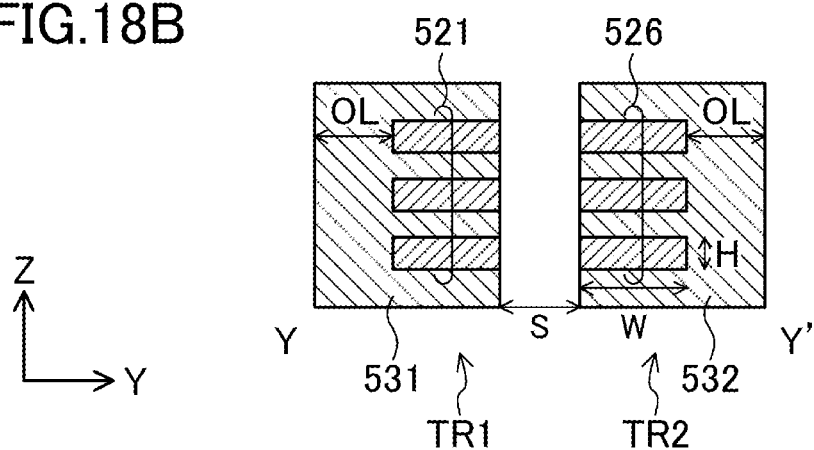
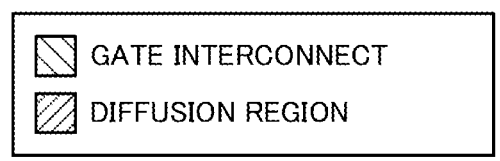

TWO PORT SRAM DEVICE USING FORKED NANOSHEET FETS

CROSS-REFERENCE TO RELATED APPLICATIONS

This is a continuation of International Application No. PCT/JP2021/000097 filed on Jan. 5, 2021, which claims priority to Japanese Patent Application No. 2020-010882 filed on Jan. 27, 2020. The entire disclosures of these applications are incorporated by reference herein.

BACKGROUND

The present disclosure relates to a semiconductor storage device provided with nanosheet field effect transistors (FETs), and more particularly to a layout structure of a two-port static random access memory (SRAM) cell (hereinafter simply called a cell as appropriate) using nanosheet FETs.

SRAM is widely used in semiconductor integrated circuits. As SRAM, there is a two-port SRAM having one port for write and one port for read (see U.S. Pat. No. 9,646,973 (FIG. 1), for example).

As for transistors as basic constituents of an LSI, improvement in integration degree, reduction in operating voltage, and improvement in operating speed have been achieved thanks to scaling of the gate length. Recently, however, increase in off current due to excessive scaling and the resulting significant increase in power consumption have raised a problem. To solve this problem, three-dimensional transistors having a three-dimensional structure, changed from the conventional planar structure, have been vigorously studied. As one type of such three-dimensional transistors, nanosheet FETs (nanowire FETs) have received attention.

Among other types of nanosheet FETs, a forksheet transistor having a gate electrode shaped like a fork is proposed. P. Weckx et al., "Stacked nanosheet fork architecture for SRAM design and device co-optimization toward 3 nm," 2017 IEEE International Electron Devices Meeting (IEDM), December 2017, IEDM17-505-508 discloses a layout of an SRAM cell using forksheet transistors, whereby reduction in the area of a semiconductor storage device has been achieved.

P. Weckx et al., "Novel forksheet device architecture as ultimate logic scaling device towards 2 nm," 2019 IEEE International Electron Devices Meeting (IEDM), December 2019, IEDM19-871-874 also discloses forksheet transistors.

Note that the nanosheet FET having a fork-shaped gate electrode is hereinafter called a forksheet transistor following the prior art.

Thus far, however, no concrete examination has been made on the layout of a two-port SRAM cell using forksheet transistors.

An objective of the present disclosure is providing a layout structure of a two-port SRAM cell using forksheet transistors.

SUMMARY

According to the first mode of the present disclosure, a semiconductor storage device including a two-port SRAM cell is provided, the two-port SRAM cell including: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to a first bit line at one of its nodes, to the first node at the other node, and to a first word line at its gate; a fourth transistor connected to a second bit line at one of its nodes, to the second node at the other node, and to the first word line at its gate, the first bit line and the second bit line constituting a first complementary bit line pair; a fifth transistor connected to a third bit line at one of its nodes, to the first node at the other node, and to a second word line at its gate; a sixth transistor connected to a fourth bit line at one of its nodes, to the second node at the other node, and to the second word line at its gate, the third bit line and the fourth bit line constituting a second complementary bit line pair; a seventh transistor connected to the first node at one of its nodes, to a second power supply supplying a second voltage different from the first voltage at the other node, and to the second node at its gate; and an eighth transistor connected to the second node at one of its nodes, to the second power supply at the other node, and to the first node at its gate. The first to eighth transistors respectively include first to eighth nanosheets extending in a first direction, and first to eighth gate interconnects surrounding the first to eighth nanosheets, respectively, in a second direction vertical to the first direction and in a third direction perpendicular to the first and second directions. The fifth, second, eighth, and sixth nanosheets are formed in line in this order in the second direction. The third, seventh, first, and fourth nanosheets are formed in line in this order in the second direction. Faces of the second, fourth, sixth, and seventh nanosheets on a first side as one of the opposite sides in the second direction are exposed from the second, fourth, sixth, and seventh gate interconnects, respectively. Faces of the first, third, fifth, and eighth nanosheets on a second side as the other side in the second direction are exposed from the first, third, fifth, and eighth gate interconnects, respectively.

According to the present disclosure, the first to eighth transistors are each constituted by a forksheet transistor. Therefore, a two-port SRAM cell using forksheet transistors is implemented.

When the first side is the side on which the seventh nanosheet is opposed to the third nanosheet and the side on which the sixth nanosheet is opposed to the eighth nanosheet, the faces of the third and seventh nanosheets opposed to each other are exposed from the third and seventh gate interconnects, respectively, and the faces of the sixth and eighth nanosheets opposed to each other are exposed from the sixth and eighth gate interconnects, respectively. This makes it possible to reduce the area of the semiconductor storage device.

When the first side is the side on which the seventh nanosheet is opposed to the first nanosheet and the side on which the second nanosheet is opposed to the eighth nanosheet, the faces of the first and seventh nanosheets opposed to each other are exposed from the first and seventh gate interconnects, respectively, and the faces of the second and eighth nanosheets opposed to each other are exposed from the second and eighth gate interconnects, respectively. This makes it possible to reduce the area of the semiconductor storage device.

Thus, in addition to implementing a two-port SRAM cell using forksheet transistors, it is possible to achieve reduction in the area of the semiconductor storage device.

According to the second mode of the present disclosure, a semiconductor storage device including a two-port SRAM cell is provided, the two-port SRAM cell including: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to a first bit line at one of its nodes, to the first node at the other node, and to a first word line at its gate; a fourth transistor connected to a second bit line at one of its nodes, to the second node at the other node, and to the first word line at its gate, the first bit line and the second bit line constituting a first complementary bit line pair; a fifth transistor connected to a third bit line at one of its nodes, to the first node at the other node, and to a second word line at its gate; a sixth transistor connected to a fourth bit line at one of its nodes, to the second node at the other node, and to the second word line at its gate, the third bit line and the fourth bit line constituting a second complementary bit line pair; a seventh transistor connected to the first node at one of its nodes, to a second power supply supplying a second voltage different from the first voltage at the other node, and to the second node at its gate; and an eighth transistor connected to the second node at one of its nodes, to the second power supply at the other node, and to the first node at its gate. The first to sixth transistors respectively include first to sixth nanosheets extending in a first direction, and first to sixth gate interconnects surrounding the first to sixth nanosheets, respectively, in a second direction vertical to the first direction and in a third direction perpendicular to the first and second directions. The seventh transistor includes seventh and eighth nanosheets extending in the first direction, and seventh and eighth gate interconnects surrounding the seventh and eighth nanosheets, respectively, in the second and third directions. The eighth transistor includes ninth and tenth nanosheets extending in the first direction, and ninth and tenth gate interconnects surrounding the ninth and tenth nanosheets, respectively, in the second and third directions. The fifth, second, ninth, tenth, and sixth nanosheets are formed in line in this order in the second direction. The third, seventh, eighth, first, and fourth nanosheets are formed in line in this order in the second direction. Faces of the first, sixth, seventh, and ninth nanosheets on a first side as one of the opposite sides in the second direction are exposed from the first, sixth, seventh, and ninth gate interconnects, respectively. Faces of the second, third, eighth, and tenth nanosheets on a second side as the other side in the second direction are exposed from the second, third, eighth, and tenth gate interconnects, respectively. A face of the fourth nanosheet on either the first or second side is exposed from the fourth gate interconnect. A face of the fifth nanosheet on either the first or second side is exposed from the fifth gate interconnect.

According to the present disclosure, the first to eighth transistors are each constituted by a forksheet transistor. Therefore, a two-port SRAM cell using forksheet transistors is implemented.

When the first side is the side on which the ninth nanosheet is opposed to the second nanosheet, the side on which the sixth nanosheet is opposed to the tenth nanosheet, the side on which the seventh nanosheet is opposed to the third nanosheet, and the side on which the first nanosheet is opposed to the eighth nanosheet, the faces of the second and ninth nanosheets opposed to each other are exposed from the second and ninth gate interconnects, respectively, the faces of the sixth and tenth nanosheets opposed to each other are exposed from the sixth and tenth gate interconnects, respectively, the faces of the third and seventh nanosheets opposed to each other are exposed from the third and seventh gate interconnects, respectively, and the faces of the first and eighth nanosheets opposed to each other are exposed from the first and eighth gate interconnects, respectively. This makes it possible to reduce the area of the semiconductor storage device.

When the first side is the side on which the eighth nanosheet is opposed to the seventh nanosheet and the side on which the tenth nanosheet is opposed to the ninth nanosheet, the faces of the seventh and eighth nanosheets opposed to each other are exposed from the seventh and eighth gate interconnects, respectively, and the faces of the ninth and tenth nanosheets opposed to each other are exposed from the ninth and tenth gate interconnects, respectively. This makes it possible to reduce the area of the semiconductor storage device.

Thus, in addition to implementing a two-port SRAM cell using forksheet transistors, it is possible to achieve reduction in the area of the semiconductor storage device.

According to the third mode of the present disclosure, a semiconductor storage device including a two-port SRAM cell is provided, the two-port SRAM cell including: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to a first bit line at one of its nodes, to the first node at the other node, and to a first word line at its gate; a fourth transistor connected to a second bit line at one of its nodes, to the second node at the other node, and to the first word line at its gate, the first bit line and the second bit line constituting a first complementary bit line pair; a fifth transistor connected to a third bit line at one of its nodes, to the first node at the other node, and to a second word line at its gate; a sixth transistor connected to a fourth bit line at one of its nodes, to the second node at the other node, and to the second word line at its gate, the third bit line and the fourth bit line constituting a second complementary bit line pair; a seventh transistor connected to the first node at one of its nodes, to a second power supply supplying a second voltage different from the first voltage at the other node, and to the second node at its gate; and an eighth transistor connected to the second node at one of its nodes, to the second power supply at the other node, and to the first node at its gate. The first to sixth transistors respectively include first to sixth nanosheets extending in a first direction, and first to sixth gate interconnects surrounding the first to sixth nanosheets, respectively, in a second direction vertical to the first direction and in a third direction perpendicular to the first and second directions. The seventh transistor includes seventh and eighth nanosheets extending in the first direction, and seventh and eighth gate interconnects surrounding the seventh and eighth nanosheets, respectively, in the second and third directions. The eighth transistor includes ninth and tenth nanosheets extending in the first direction, and ninth and tenth gate interconnects surrounding the ninth and tenth nanosheets, respectively, in the second and third directions. The sixth, fifth, second, ninth, and tenth nanosheets are formed in line in this order in the second direction. The seventh, eighth, first, fourth, and third nanosheets are formed in line in this order in the second direction. Faces of the second, sixth, eighth, and tenth nanosheets on a first side as one of the opposite sides in the second direction are exposed from the second, sixth, eighth, and tenth gate interconnects, respectively. Faces of the first, third, seventh, and ninth nanosheets on a second side as the other side in the second direction are exposed from the first, third, seventh, and ninth gate interconnects, respectively. A face of the fourth nanosheet on either the first or second side is exposed from the fourth gate interconnect. A face of the fifth nanosheet on either the first or second side is exposed from the fifth gate interconnect.

According to the present disclosure, the first to eighth transistors are each constituted by a forksheet transistor. Therefore, a two-port SRAM cell using forksheet transistors is implemented.

When the first side is the side on which the tenth nanosheet is opposed to the ninth nanosheet and the side on which the eighth nanosheet is opposed to the seventh nanosheet, the faces of the ninth and tenth nanosheets opposed to each other are exposed from the ninth and tenth gate interconnects, respectively, and the faces of the seventh and eighth nanosheets opposed to each other are exposed from the seventh and eighth gate interconnects, respectively. This makes it possible to reduce the area of the semiconductor storage device.

When the first side is the side on which the second nanosheet is opposed to the ninth nanosheet and the side on which the eighth nanosheet is opposed to the first nanosheet, the faces of the second and ninth nanosheets opposed to each other are exposed from the second and ninth gate interconnects, respectively, and the faces of the first and eighth nanosheets opposed to each other are exposed from the first and eighth gate interconnects, respectively. This makes it possible to reduce the area of the semiconductor storage device.

Thus, in addition to implementing a two-port SRAM cell using forksheet transistors, it is possible to achieve reduction in the area of the semiconductor storage device.

According to the fourth mode of the present disclosure, a semiconductor storage device including a two-port SRAM cell is provided, the two-port SRAM cell including: a first transistor connected to a first power supply supplying a first voltage at one of its nodes, to a first node at the other node, and to a second node at its gate; a second transistor connected to the first power supply at one of its nodes, to the second node at the other node, and to the first node at its gate; a third transistor connected to a first bit line at one of its nodes, to the first node at the other node, and to a first word line at its gate; a fourth transistor connected to a second bit line at one of its nodes, to the second node at the other node, and to the first word line at its gate, the first bit line and the second bit line constituting a first complementary bit line pair; a fifth transistor connected to a third bit line at one of its nodes, to the first node at the other node, and to a second word line at its gate; a sixth transistor connected to a fourth bit line at one of its nodes, to the second node at the other node, and to the second word line at its gate, the third bit line and the fourth bit line constituting a second complementary bit line pair; a seventh transistor connected to the first node at one of its nodes, to a second power supply supplying a second voltage different from the first voltage at the other node, and to the second node at its gate; and an eighth transistor connected to the second node at one of its nodes, to the second power supply at the other node, and to the first node at its gate. The first to sixth transistors respectively include first to sixth nanosheets extending in a first direction, and first to sixth gate interconnects surrounding the first to sixth nanosheets, respectively, in a second direction vertical to the first direction and in a third direction perpendicular to the first and second directions. The seventh transistor includes seventh and eighth nanosheets extending in the first direction, and seventh and eighth gate interconnects surrounding the seventh and eighth nanosheets, respectively, in the second and third directions. The eighth transistor includes ninth and tenth nanosheets extending in the first direction, and ninth and tenth gate interconnects surrounding the ninth and tenth nanosheets, respectively, in the second and third directions. The fifth, third, second, ninth, and tenth nanosheets are formed in line in this order in the second direction. The seventh, eighth, first, sixth, and fourth nanosheets are formed in line in this order in the second direction. Faces of the first, fifth, sixth, seventh, and ninth nanosheets on a first side as one of the opposite sides in the second direction are exposed from the first, fifth, sixth, seventh, and ninth gate interconnects, respectively. Faces of the second, third, fourth, eighth, and tenth nanosheets on a second side as the other side in the second direction are exposed from the second, third, fourth, eighth, and tenth gate interconnects, respectively.

According to the present disclosure, the first to eighth transistors are each constituted by a forksheet transistor. Therefore, a two-port SRAM cell using forksheet transistors is implemented.

When the first side is the side on which the ninth nanosheet is opposed to the second nanosheet and the side on which the first nanosheet is opposed to the eighth nanosheet, the faces of the second and ninth nanosheets opposed to each other are exposed from the second and ninth gate interconnects, respectively, and the faces of the first and eighth nanosheets opposed to each other are exposed from the first and eighth gate interconnects, respectively. This makes it possible to reduce the area of the semiconductor storage device.

When the first side is the side on which the fifth nanosheet is opposed to the third nanosheet, the side on which the ninth nanosheet is opposed to the tenth nanosheet, the side on which the seventh nanosheet is opposed to the eighth nanosheet, and the side on which the sixth nanosheet is opposed to the fourth nanosheet, the faces of the third and fifth nanosheets opposed to each other are exposed from the third and fifth gate interconnects, respectively, the faces of the ninth and tenth nanosheets opposed to each other are exposed from the ninth and tenth gate interconnects, respectively, the faces of the seventh and eighth nanosheets opposed to each other are exposed from the seventh and eighth gate interconnects, respectively, and the faces of the fourth and sixth nanosheets opposed to each other are exposed from the fourth and sixth gate interconnects, respectively. This makes it possible to reduce the area of the semiconductor storage device.

Thus, in addition to implementing a two-port SRAM cell using forksheet transistors, it is possible to achieve reduction in the area of the semiconductor storage device.

According to the present disclosure, a two-port SRAM cell using forksheet transistors can be implemented, and also reduction in the area of a semiconductor storage device can be achieved.

BRIEF DESCRIPTION OF THE DRAWINGS

FIGS. 2A-2C are cross-sectional views showing the layout structure of the two-port SRAM cell according to the first embodiment.

FIGS. 7A-7B are plan views showing yet another example of the layout structure of the two-port SRAM cell according to the first embodiment.

FIGS. 11A-11B are plan views showing yet another example of the layout structure of the two-port SRAM cell according to the first embodiment.

FIGS. 12A-12B are plan views showing an example of the layout structure of a two-port SRAM cell according to the second embodiment.

FIGS. 13A-13B are plan views showing another example of the layout structure of the two-port SRAM cell according to the second embodiment.

FIGS. 14A-14B are plan views showing yet another example of the layout structure of the two-port SRAM cell according to the second embodiment.

FIGS. 15A-15B are plan views showing yet another example of the layout structure of the two-port SRAM cell according to the second embodiment.

FIGS. 18A-18B are views showing a basic structure of a forksheet FET.

DETAILED DESCRIPTION

Figures 1A, 1B:
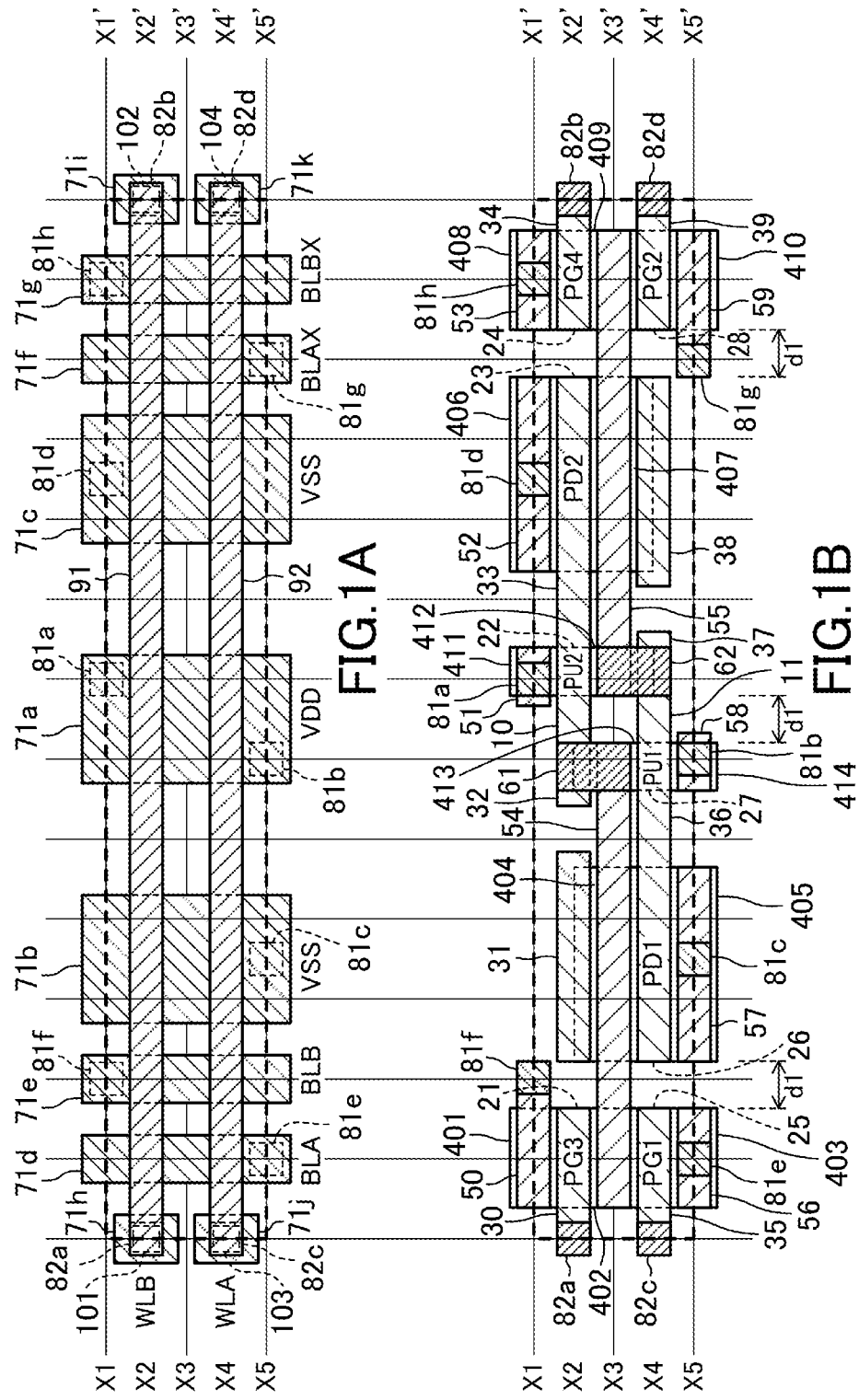
FIGS. 1A-1B are plan views showing an example of the layout structure of a two-port SRAM cell according to the first embodiment.

Embodiments of the present disclosure will be described hereinafter with reference to the accompanying drawings. In the following embodiments, it is assumed that the semiconductor storage device includes a plurality of SRAM cells (hereinafter simply called cells as appropriate), and at least some of the SRAM cells include forksheet transistors each having a fork-shaped gate electrode, among nanosheet FETs (nanowire FETs). The nanosheet FET is a FET using a thin sheet (nanosheet) through which a current flows. Such a nanosheet is formed of silicon, for example. In the semiconductor storage device, it is assumed that some of the nanosheet FETs are forksheet FETs.

In the present disclosure, a semiconductor layer portion formed on each end of a nanosheet to constitute a terminal that is to be the source or drain of a nanosheet FET is called a "pad." Also, hereinafter, in the plan views such as FIGS. 1A-1B, the vertical direction in the figure is called a Y direction (corresponding to the first direction), the horizontal direction in the figure is called an X direction (corresponding to the second direction), and the direction perpendicular to the substrate plane is called a Z direction (corresponding to the third direction).

Structure of Forksheet

FIGS. 18A-18B are views showing a basic structure of a forksheet FET, where FIG. 18A is a plan view and FIG. 18B is a cross-sectional view taken along line Y-Y' in FIG. 18A. In the basic structure of FIGS. 18A-18B, two transistors TR1 and TR2 are placed side by side with space S between them in the Y direction. A gate interconnect 531 that is to be the gate of the transistor TR1 and a gate interconnect 532 that is to be the gate of the transistor TR2 extend in the Y direction and are at the same position in the X direction.

A channel portion 521 that is to be the channel region of the transistor TR1 and a channel portion 526 that is to be the channel region of the transistor TR2 are constituted by nanosheets. In FIGS. 18A-18B, the channel portions 521 and 526 are each constituted by a stacked structure of three nanosheets coinciding with one another as viewed in plan. Pads 522$a$ and 522$b$ that are to be the source and drain regions of the transistor TR1 are formed on both sides of the channel portion 521 in the X direction. Pads 527$a$ and 527$b$ that are to be the source and drain regions of the transistor TR2 are formed on both sides of the channel portion 526 in the X direction. The pads 522$a$ and 522$b$ are formed by epitaxial growth from the nanosheets constituting the channel portion 521. The pads 527$a$ and 527$b$ are formed by epitaxial growth from the nanosheets constituting the channel portion 526.

The gate interconnect 531 surrounds the peripheries of the nanosheets constituting the channel portion 521 in the Y and Z directions via a gate insulating film (not shown). Note however that the faces of the nanosheets constituting the channel portion 521 on the side closer to the transistor TR2 in the Y direction are exposed, not covered with the gate interconnect 531. That is, in the cross-sectional view of FIG. 18B, the gate interconnect 531 does not cover the right side faces of the nanosheets constituting the channel portion 521 but covers the upper, lower, and left side faces of the nanosheets. The gate interconnect 531 protrudes from the nanosheets constituting the channel portion 521 by a length OL toward the side away from the transistor TR2 in the Y direction.

The gate interconnect 532 surrounds the peripheries of the nanosheets constituting the channel portion 526 in the Y and Z directions via a gate insulating film (not shown). Note however that the faces of the nanosheets constituting the channel portion 526 on the side closer to the transistor TR1 in the Y direction are exposed, not covered with the gate interconnect 532. That is, in the cross-sectional view of FIG. 18B, the gate interconnect 532 does not cover the left side faces of the nanosheets constituting the channel portion 526 but covers the upper, lower, and right side faces of the nanosheets. The gate interconnect 532 protrudes from the nanosheets constituting the channel portion 526 by a length OL toward the side away from the transistor TR1 in the Y direction.

Here, the gate effective width Weff of each nanosheet is represented by $$Weff = 2 \times W + H$$

where W is the width (size in the Y direction) of the nanosheet, and H is the height (size in the Z direction) thereof. Since the channel portions 521 and 526 of the transistors TR1 and TR2 are each constituted by three nanosheets, the gate effective width of each of the transistors TR1 and TR2 is $$3 \times (2 \times W + H).$$

In the structure of FIGS. 18A-18B, the gate interconnect 531 does not protrude from the nanosheets constituting the channel portion 521 toward the transistor TR2 in the Y direction. Also, the gate interconnect 532 does not protrude from the nanosheets constituting the channel portion 526 toward the transistor TR1 in the Y direction. This can bring the transistors TR1 and TR2 closer to each other and thus achieve area reduction.

The number of nanosheets constituting the channel portion of each transistor is not limited to three. The channel portion may be constituted by one nanosheet, or may be constituted by a stacked structure of a plurality of nanosheets. Also, while the cross-sectional shape of the nanosheets is illustrated as rectangular in FIG. 18B, it is not limited to this. For example, the shape may be square, circular, or oval.

The semiconductor storage device may include both forksheet FETs and other nanosheet FETs where a gate interconnect surrounds the entire peripheries of nanosheets, in a mixed manner.

As used herein, "VDD" and "VSS" refer to the power supply voltages or the power supplies themselves. Also, as used herein, an expression indicating that sizes such as widths are identical, like the "same wiring width," is to be understood as including a range of manufacturing variations.

In the plan views and the cross-sectional views in the following embodiments, illustration of various insulating films may be omitted. Also, nanosheets and pads on both ends of the nanosheets may be illustrated in simplified linear shapes.

The source and drain of a transistor are herein called the "nodes" of the transistor as appropriate. That is, one node of a transistor refers to the source or drain of the transistor, and both nodes of a transistor refer to the source and drain of the transistor.

In the following embodiments and alterations, like components are denoted by the same reference characters and description thereof may be omitted.

First Embodiment

Figures 3A, 3B:
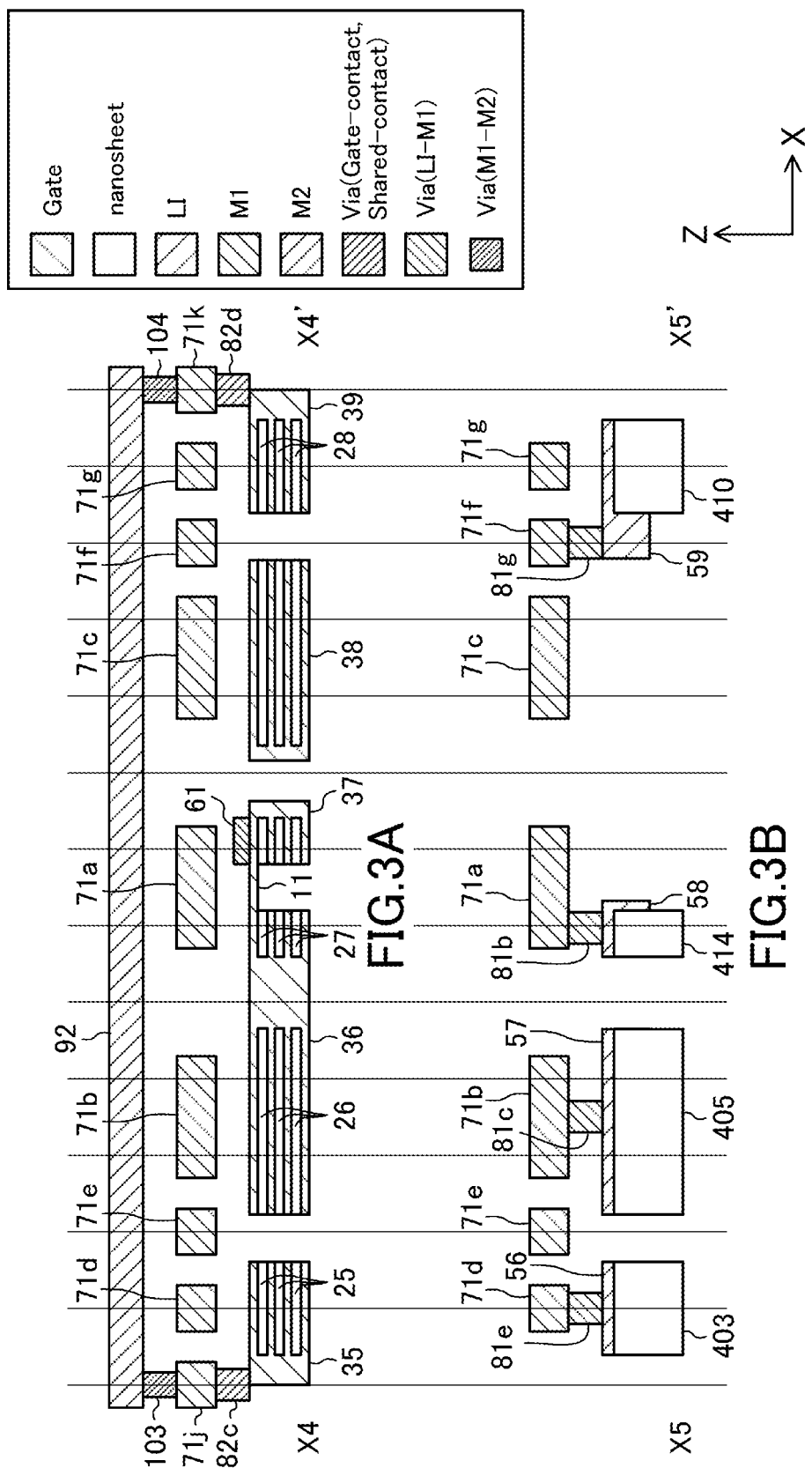
FIGS. 3A-3B are cross-sectional views showing the layout structure of the two-port SRAM cell according to the first embodiment.

FIGS. 1A-1B to FIGS. 3A-3B are views showing an example of the layout structure of a two-port SRAM cell according to the first embodiment, where FIGS. 1A and 1B are plan views, and FIGS. 2A to 2C, 3A, and 3B are cross-sectional views taken in the horizontal direction as viewed in plan. Specifically, FIG. 1A shows an upper part of the cell including M1 and M2 interconnect layers, and FIG. 1B shows a lower part of the cell that is lower than the M1 and M2 interconnect layers and includes nanosheet FETs. FIG. 2A shows a cross section taken along line X1-X1', FIG. 2B shows a cross section taken along line X2-X2', FIG. 2C shows a cross section taken along line X3-X3', FIG. 3A shows a cross section taken along line X4-X4', and FIG. 3B shows a cross section taken along line X5-X5'.

Figure 4:
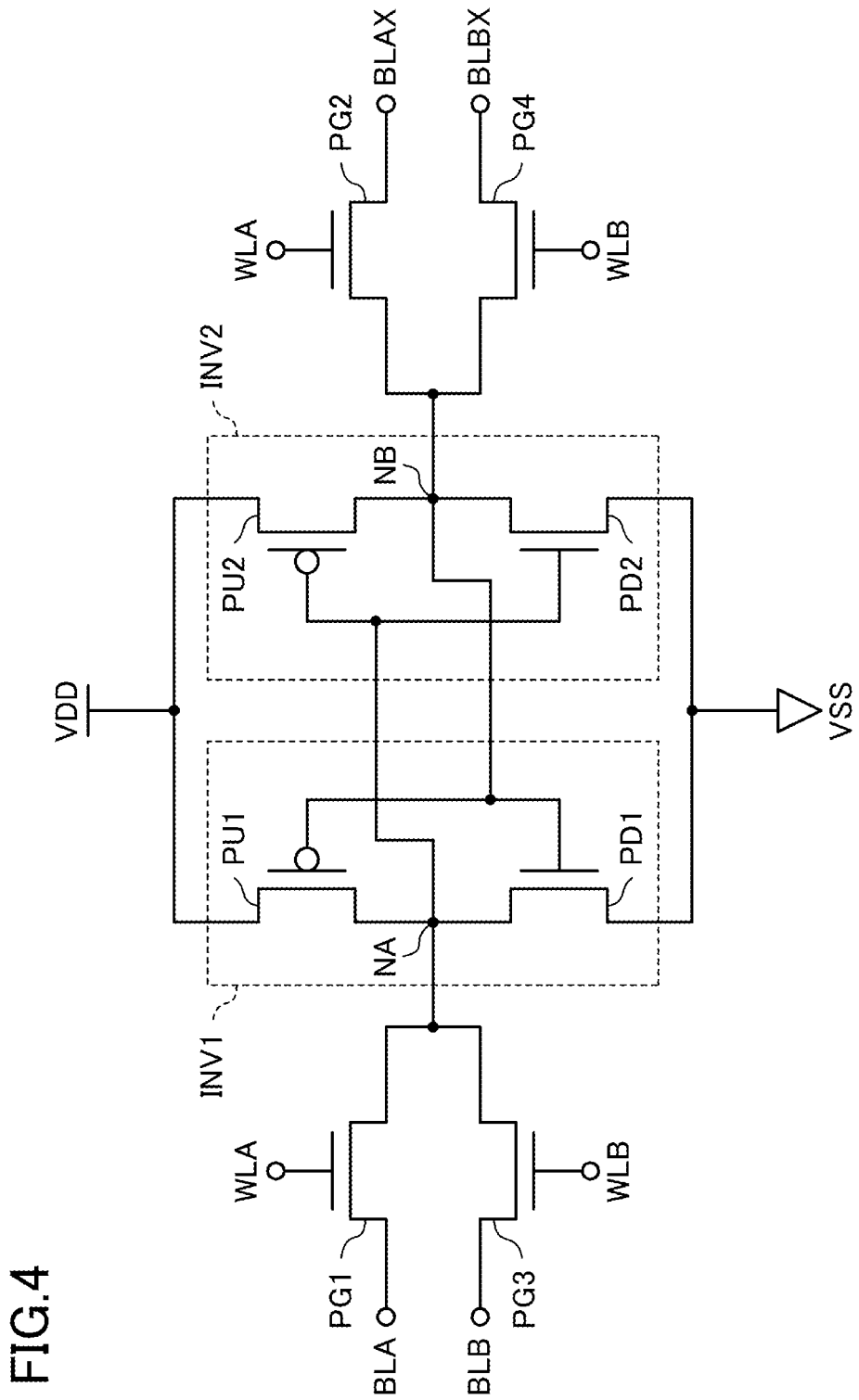
FIG. 4 is a circuit diagram showing a configuration of the two-port SRAM cell according to the first embodiment.

FIG. 4 is a circuit diagram showing a configuration of the two-port SRAM cell according to the first embodiment. As shown in FIG. 4, the two-port SRAM cell of this embodiment constitutes a two-port SRAM circuit including load transistors PU1 and PU2, drive transistors PD1 and PD2, and access transistors PG1 to PG4. The load transistors PU1 and PU2 are p-type FETs, and the drive transistors PD1 and PD2 and the access transistors PG1 to PG4 are n-type FETs.

The load transistor PU1 is provided between a power supply VDD and a first node NA, and the drive transistor PD1 is provided between the first node NA and a power supply VSS. The gates of the load transistor PU1 and the drive transistor PD1 are connected to a second node NB, whereby these transistors constitute an inverter INV1. The load transistor PU2 is provided between the power supply VDD and the second node NB, and the drive transistor PD2 is provided between the second node NB and the power supply VSS. The gates of the load transistor PU2 and the drive transistor PD2 are connected to the first node NA, whereby these transistors constitute an inverter INV2. That is, the output of one of the inverters is connected to the input of the other inverter, whereby a latch is formed.

The access transistor PG1 is provided between a first bit line BLA and the first node NA, and its gate is connected to a first word line WLA. The access transistor PG2 is provided between a second bit line BLAX and the second node NB, and its gate is connected to the first word line WLA. The access transistor PG3 is provided between a third bit line BLB and the first node NA, and its gate is connected to a second word line WLB. The access transistor PG4 is provided between a fourth bit line BLBX and the second node NB, and its gate is connected to the second word line WLB. The first and second bit lines BLA and BLAX constitute a first complementary bit line pair, and the third and fourth bit lines BLB and BLBX constitute a second complementary bit line pair.

In the two-port SRAM circuit, when the first and second bit lines BLA and BLAX constituting the first complementary bit line pair are driven to HIGH level and LOW level, respectively, and the first word line WLA is driven to HIGH level, HIGH level is written into the first node NA and LOW level is written into the second node NB. By contrast, when the first and second bit lines BLA and BLAX are driven to LOW level and HIGH level, respectively, and the first word line WLA is driven to HIGH level, LOW level is written into the first node NA and HIGH level is written into the second node NB. In such a state where the first and second nodes NA and NB have written data, when the first word line WLA is driven to LOW level, a latched state is established, whereby the data written in the first and second nodes NA and NB are retained.

Also, when the first and second bit lines BLA and BLAX are precharged to HIGH level in advance, and in this state, the first word line WLA is driven to HIGH level, the states of the first and second bit lines BLA and BLAX are determined depending on the data written in the first and second nodes NA and NB, whereby read of data from the SRAM cell can be performed. Specifically, when the first node NA is in HIGH level and the second node NB is in LOW level, the first bit line BLA retains HIGH level and the second bit line BLAX is discharged to LOW level. By contrast, when the first node NA is in LOW level and the second node NB is in HIGH level, the first bit line BLA is discharged to LOW level and the second bit line BLAX retains HIGH level.

Likewise, when the third and fourth bit lines BLB and BLBX constituting the second complementary bit line pair are driven to HIGH level and LOW level, respectively, and the second word line WLB is driven to HIGH level, HIGH level is written into the first node NA and LOW level is written into the second node NB. By contrast, when the third and fourth bit lines BLB and BLBX are driven to LOW level and HIGH level, respectively, and the second word line WLB is driven to HIGH level, LOW level is written into the first node NA and HIGH level is written into the second node NB. In such a state where the first and second nodes NA and NB have written data, when the second word line WLB is driven to LOW level, a latched state is established, whereby the data written in the first and second nodes NA and NB are retained.

Also, when the third and fourth bit lines BLB and BLBX are precharged to HIGH level in advance, and in this state, the second word line WLB is driven to HIGH level, the states of the third and fourth bit lines BLB and BLBX are determined depending on the data written in the first and second nodes NA and NB, whereby read of data from the SRAM cell can be performed. Specifically, when the first node NA is in HIGH level and the second node NB is in LOW level, the third bit line BLB retains HIGH level and the fourth bit line BLBX is discharged to LOW level. By contrast, when the first node NA is in LOW level and the second node NB is in HIGH level, the third bit line BLB is discharged to LOW level and the fourth bit line BLBX retains HIGH level.

As described above, the two-port SRAM cell has functions of data write into the SRAM cell, data retention, and data read from the SRAM cell by controlling the first and second bit lines BLA and BLAX and the first word line WLA. Also, the two-port SRAM cell has functions of data write into the SRAM cell, data retention, and data read from the SRAM cell by controlling the third and fourth bit lines BLB and BLBX and the second word line WLB.

Note that the solid lines running horizontally and vertically in the plan views such as FIGS. 1A-1B and the solid lines running vertically in the cross-sectional views such as FIGS. 2A-2C represent grid lines used for placement of components at the time of designing. The grid lines are arranged at equal spacing in the X direction and arranged at equal spacing in the Y direction. The grid spacings in the X and Y directions may be the same, or different from each other. Also, the grid spacings may be different between layers. Further, the components are not necessarily required to lie on grid lines. It is however preferable to place the components on grid lines from the standpoint of reducing manufacturing variations.

The dashed line drawn to surround a cell in the plan views such as FIGS. 1A-1B defines the bounds of the two-port SRAM cell (the outer rim of the two-port SRAM cell). The two-port SRAM cell is placed so that its rim touches a rim of a cell adjacent in the X direction or the Y direction.

In the plan views such as FIGS. 1A-1B, an inverted one of the two-port SRAM cell in the X direction is placed on each side of the two-port SRAM cell in the X direction, and an inverted one of the two-port SRAM cell in the Y direction is placed on each side of the two-port SRAM cell in the Y direction.

As shown in FIG. 1B, nanosheets 21 to 28 extending in the X and Y directions are formed. The nanosheets 21 to 24 are arranged in this order in the X direction, and the nanosheets 25 to 28 are arranged in this order in the X direction. Also, the nanosheets 21 and 25 are formed side by side in the Y direction, and the nanosheets 24 and 28 are formed side by side in the Y direction.

The width of the nanosheets 21, 24, 25, and 28 is double the width of the nanosheets 22 and 27 in the X direction, and the width of the nanosheets 23 and 26 is four times the width of the nanosheets 22 and 27 in the X direction.

The nanosheets 21 and 25 are formed close to the cell boundary on the left side in the figure, and the nanosheets 24 and 28 are formed close to the cell boundary on the right side in the figure.

The nanosheets 21 to 28 constitute the channel portions of the access transistor PG3, the load transistor PU2, the drive transistor PD2, the access transistors PG4 and PG1, the drive transistor PD1, the load transistor PU1, and the access transistor PG2, respectively.

Gate interconnects (gates) 30 to 39 extend in the X and Z directions. The gate interconnects 30 to 34 are arranged in the X direction, and the gate interconnects 35 to 39 are arranged in the X direction.

The gate interconnect 30 overlaps the nanosheets 21 as viewed in plan, the gate interconnect 33 overlaps the nanosheets 22 and 23 as viewed in plan, the gate interconnect 34 overlaps the nanosheets 24 as viewed in plan, the gate interconnect 35 overlaps the nanosheets 25 as viewed in plan, the gate interconnect 36 overlaps the nanosheets 26 and 27 as viewed in plan, and the gate interconnect 39 overlaps the nanosheets 28 as viewed in plan.

The gate interconnect 30 is to be the gate of the access transistor PG3, the gate interconnect 33 is to be the gates of the load transistor PU2 and the drive transistor PD2, the gate interconnect 34 is to be the gate of the access transistor PG4, the gate interconnect 35 is to be the gate of the access transistor PG1, the gate interconnect 36 is to be the gates of the drive transistor PD1 and the load transistor PU1, and the gate interconnect 39 is to be the gate of the access transistor PG2.

The gate interconnects 32 and 33 are mutually connected through a bridge 10 extending in the X direction. The gate interconnects 36 and 37 are mutually connected through a bridge 11 extending in the X direction.

Pads 401 to 410 doped with an n-type semiconductor are formed at the upper end of the nanosheets 21, between the nanosheets 21 and 25, at the lower end of the nanosheets 25, at the upper end of the nanosheets 26, at the lower end of the nanosheets 26, at the upper end of the nanosheets 23, at the lower end of the nanosheets 23, at the upper end of the nanosheets 24, between the nanosheets 24 and 28, and at the lower end of the nanosheets 28, respectively, as viewed in the figure. The pads 401 and 402 constitute the nodes of the access transistor PG3, the pads 402 and 403 constitute the nodes of the access transistor PG1, the pads 404 and 405 constitute the nodes of the drive transistor PD1, the pads 406 and 407 constitute the nodes of the drive transistor PD2, the pads 408 and 409 constitute the nodes of the access transistor PG4, and the pads 409 and 410 constitute the nodes of the access transistor PG2.

That is, the access transistor PG3 is constituted by the nanosheets 21, the gate interconnect 30, and the pads 401 and 402. The drive transistor PD2 is constituted by the nanosheets 23, the gate interconnect 33, and the pads 406 and 407. The access transistor PG4 is constituted by the nanosheets 24, the gate interconnect 34, and the pads 408 and 409. The access transistor PG1 is constituted by the nanosheets 25, the gate interconnect 35, and the pads 402 and 403. The drive transistor PD1 is constituted by the nanosheets 26, the gate interconnect 36, and the pads 404 and 405. The access transistor PG2 is constituted by the nanosheets 28, the gate interconnect 39, and the pads 409 and 410.

Pads 411 to 414 doped with a p-type semiconductor are formed at the upper end of the nanosheets 22, at the lower end of the nanosheets 22, at the upper end of the nanosheets 27, and at the lower end of the nanosheets 27, respectively, as viewed in the figure. The pads 411 and 412 constitute the nodes of the load transistor PU2, and the pads 413 and 414 constitute the nodes of the load transistor PU1.

That is, the load transistor PU2 is constituted by the nanosheets 22, the gate interconnect 33, and the pads 411 and 412. The load transistor PU1 is constituted by the nanosheets 27, the gate interconnect 36, and the pads 413 and 414.

Thus, the access transistor PG3, the load transistor PU2, the drive transistor PD2, and the access transistor PG4 are formed in line in the X direction. The access transistor PG1, the drive transistor PD1, the load transistor PU1, and the access transistor PG2 are formed in line in the X direction. Also, the access transistors PG3 and PG1 are formed side by side in the Y direction, and the access transistors PG4 and PG2 are formed side by side in the Y direction.

In a local interconnect layer located above the transistors, local interconnects (LI) 50 to 59 extending in the X direction are formed. The local interconnect 50 is connected with the pad 401, the local interconnect 51 is connected with the pad 411, the local interconnect 52 is connected with the pad 406, the local interconnect 53 is connected with the pad 408, the local interconnect 54 is connected with the pads 402, 404, and 413, the local interconnect 55 is connected with the pads 412, 407, 409, the local interconnect 56 is connected with the pad 403, the local interconnect 57 is connected with the pad 405, the local interconnect 58 is connected with the pad 414, and the local interconnect 59 is connected with the pad 410.

Also, the local interconnect 54 is connected with the gate interconnect 32 through a shared contact 61, and the local interconnect 55 is connected with the gate interconnect 37 through a shared contact 62. The gate interconnects 32 and 33, the bridge 10, the local interconnect 54, and the shared contact 61 correspond to the first node NA. The gate interconnects 36 and 37, the bridge 11, the local interconnect 55, and the shared contact 62 correspond to the second node NB.

As shown in FIG. 1A, in the M1 interconnect layer, formed are interconnects 71a to 71g extending in the Y direction across the cell from the upper to lower ends in the figure. Also, interconnects 71h to 71k are formed. The interconnect 71a supplies the power supply voltage VDD, and the interconnects 71b and 71c supply the power supply voltage VSS. The interconnects 71d to 71g correspond to the first bit line BLA, the third bit line BLB, the second bit line BLAX, and the fourth bit line BLBX, respectively.

The interconnect 71a is connected with the local interconnect 51 through a contact (via) 81a, and also connected with the local interconnect 58 through a contact 81b. The interconnect 71b is connected with the local interconnect 57 through a contact 81c, and the interconnect 71c is connected with the local interconnect 52 through a contact 81d. The interconnect 71d is connected with the local interconnect 56 through a contact 81e, the interconnect 71e is connected with the local interconnect 50 through a contact 81f, the interconnect 71f is connected with the local interconnect 59 through a contact 81g, and the interconnect 71g is connected with the local interconnect 53 through a contact 81h.

The interconnect 71h is connected with the gate interconnect 30 through a contact (gate-contact) 82a, the interconnect 71i is connected with the gate interconnect 34 through a contact 82b, the interconnect 71j is connected with the gate interconnect 35 through a contact 82c, and the interconnect 71k is connected with the gate interconnect 39 through a contact 82d.

In the M2 interconnect layer above the M1 interconnect layer, formed are interconnects 91 and 92 extending in the X direction across the cell from the left to right ends in the figure. The interconnect 91 corresponds to the second word line WLB, and the interconnect 92 corresponds to the first word line WLA.

The interconnect 91 is connected with the interconnect 71h through a contact 101 and also connected with the interconnect 71i through a contact 102. The interconnect 92 is connected with the interconnect 71j through a contact 103 and also connected with the interconnect 71k through a contact 104.

As shown in FIGS. 2B and 3A, the nanosheets 21 to 28 are each constituted by three sheet-like semiconductors (nanosheets). The three nanosheets of each of the nanosheets 21 to 28 are stacked on top of one another with space between them in the Z direction. That is, each of the nanosheet FETs provided in the two-port SRAM according to this embodiment includes three nanosheets.

The peripheries of the nanosheets 21 to 28 in the X and Z directions are surrounded by the gate interconnects. Note however that portions of the peripheries of the nanosheets 21 to 28 in the X and Z directions are exposed, not covered with the gate interconnects.

More specifically, the right side faces of the nanosheets 21, 23, 25, and 27 are exposed, not covered with the gate interconnects 30, 33, 35, and 36, respectively. The left side faces of the nanosheets 22, 24, 26, and 28 are exposed, not covered with the gate interconnects 33, 34, 36, and 39, respectively.

That is, the faces of the nanosheets 23 and 24 opposed to each other in the X direction are exposed from the gate interconnects 33 and 34, respectively. The faces of the nanosheets 25 and 26 opposed to each other in the X direction are exposed from the gate interconnects 35 and 36, respectively.

Also, the nanosheets 22 are formed at the upper right of the nanosheets 27 as viewed in plan. That is, the faces of the nanosheets 22 and 27 opposed to each other in the X direction are exposed from the gate interconnects 33 and 36, respectively.

Having the above configuration, in the load transistor PU1, the pad 414 is connected to the interconnect 71a supplying VDD, the pad 413 is connected to the local interconnect 54 (the first node NA), and the gate interconnect 36 is connected to the shared contact 62 (the second node NB). In the load transistor PU2, the pad 411 is connected to the interconnect 71a supplying VDD, the pad 412 is connected to the local interconnect 55 (the second node NB), and the gate interconnect 33 is connected to the shared contact 61 (the first node NA). In the drive transistor PD1, the pad 404 is connected to the local interconnect 54 (the first node NA), the pad 405 is connected to the interconnect 71b supplying VSS, and the gate interconnect 36 is connected to the shared contact 62 (the second node NB). In the drive transistor PD2, the pad 407 is connected to the local interconnect 55 (the second node NB), the pad 406 is connected to the interconnect 71c supplying VSS, and the gate interconnect 33 is connected to the shared contact 61 (the first node NA). In the access transistor PG1, the pad 403 is connected to the interconnect 71d (the first bit line BLA), the pad 402 is connected to the local interconnect 54 (the first node NA), and the gate interconnect 35 is connected to the interconnect 92 (the first word line WLA). In the access transistor PG2, the pad 410 is connected to the interconnect 71f (the second bit line BLAX), the pad 409 is connected to the local interconnect 55 (the second node NB), and the gate interconnect 39 is connected to the interconnect 92 (the first word line WLA). In the access transistor PG3, the pad 401 is connected to the interconnect 71e (the third bit line BLB), the pad 402 is connected to the local interconnect 54 (the first node NA), and the gate interconnect 30 is connected to the interconnect 91 (the second word line WLB). In the access transistor PG4, the pad 408 is connected to the interconnect 71g (the fourth bit line BLBX), the pad 409 is connected to the local interconnect 55 (the second node NB), and the gate interconnect 34 is connected to the interconnect 91 (the second word line WLB).

The load transistors PU1 and PU2, the drive transistors PD1 and PD2, and the access transistors PG1 to PG4 include the nanosheets 27, 22, 26, 23, 25, 28, 21, and 24 extending in the Y direction and the gate interconnects 36, 33, 36, 33, 35, 39, 30, and 34 extending in the X direction, respectively. The nanosheets 21 to 24 are formed in line in this order in the X direction, and the nanosheets 25 to 28 are formed in line in this order in the X direction. The gate interconnects 30, 34, 35, and 39 surround the peripheries of the nanosheets 21, 24, 25, and 28, respectively, in the X and Z directions. The gate interconnect 33 surrounds the peripheries of the nanosheets 22 and 23 in the X and Z directions. The gate interconnect 36 surrounds the peripheries of the nanosheets 26 and 27 in the X and Z directions. The right side faces of the nanosheets 21, 23, 25, and 27 in the figure are exposed from the gate interconnects 30, 33, 35, and 36, respectively. The left side faces of the nanosheets 22, 24, 26, and 28 in the figure are exposed from the gate interconnects 33, 34, 36, and 39, respectively.

That is, the load transistors PU1 and PU2, the drive transistors PD1 and PD2, and the access transistors PG1 to PG4 are each constituted by a forksheet transistor. Thus, a two-port SRAM cell using forksheet transistors is implemented.

Also, the faces of the nanosheets 23 and 24 opposed to each other in the X direction are exposed from the gate interconnects 33 and 34, respectively. The faces of the nanosheets 25 and 26 opposed to each other in the X direction are exposed from the gate interconnects 35 and 36, respectively. This can reduce the distance d1 between the drive transistor PD2 and the access transistor PG4, and between the access transistor PG1 and the drive transistor PD1, in the X direction, whereby reduction in the area of the semiconductor storage device can be achieved.

Therefore, in addition to implementing a two-port SRAM cell using forksheet transistors, it is possible to achieve reduction in the area of the semiconductor storage device.

Also, the nanosheets 22 are formed at the upper right of the nanosheets 27 as viewed in plan. That is, the faces of the nanosheets 22 and 27 opposed to each other in the X direction are exposed from the gate interconnects 33 and 36, respectively. This can reduce the distance d1 between the load transistors PU1 and PU2 in the X direction, whereby reduction in the area of the semiconductor storage device can be achieved.

While two-port SRAM cells inverted in the X direction are placed on the left and right sides of the two-port SRAM cell of FIGS. 1A-1B, the configuration is not limited to this. Instead, two-port SRAM cells non-inverted in the X direction may be placed on the left and right sides of the two-port SRAM cell of FIGS. 1A-1B.

While the width of the nanosheets 21, 24, 25, and 28 in the X direction is double the width of the nanosheets 22 and 27 in the X direction, and the width of the nanosheets 23 and 26 in the X direction is four times the width of the nanosheets 22 and 27 in the X direction, the widths are not limited to these. The widths of the nanosheets 21 to 28 in the X direction (i.e., the gate widths of the transistors) may be determined considering the operational stability, etc. of the two-port SRAM cell circuit.

The shared contacts 61 and 62 may be formed in the same process step as, or in a different process step from, the contacts 82a to 82d for connecting the gate interconnects and the M1 interconnects.

While the interconnect 71b is placed on the right side of the interconnect 71e, and the interconnect 71c is placed on the left side of the interconnect 71f, the configuration is not limited to this. The positions of the interconnects 71b and 71e may be interchanged, and the positions of the interconnects 71c and 71f may be interchanged. In this case, the interconnect 71b is to be placed between the interconnects 71d and 71e, and the interconnect 71c is to be placed between the interconnects 71f and 71g. This can reduce crosstalk between the interconnects 71d and 71e and between the interconnects 71f and 71g, that is, crosstalk between the first bit line BLA and the third bit line BLB and between the second bit line BLAX and the fourth bit line BLBX.

Otherwise, the interconnects 71d and 71e may be placed away from each other in the X direction, and the interconnects 71f and 71g may be placed away from each other in the X direction. This can reduce crosstalk between the first bit line BLA and the third bit line BLB and between the second bit line BLAX and the fourth bit line BLBX.

Alteration 1

Figures 5A, 5B:
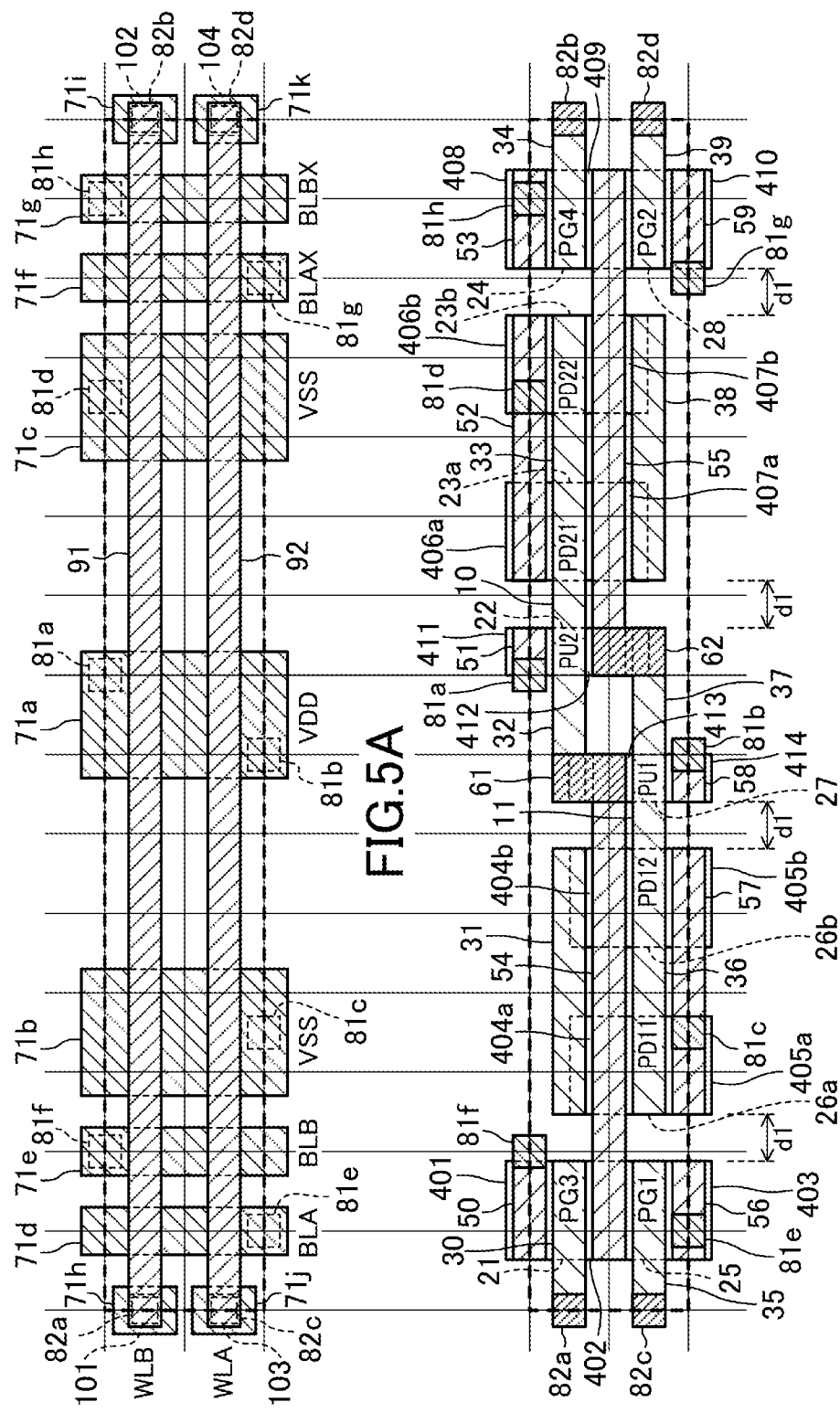
FIGS. 5A-5B are plan views showing another example of the layout structure of the two-port SRAM cell according to the first embodiment.

FIGS. 5A-5B are plan views showing another example of the layout structure of the two-port SRAM cell according to the first embodiment. Specifically, FIG. 5A shows an upper part of the cell, and FIG. 5B shows a lower part of the cell. In FIGS. 5A-5B, in comparison with FIGS. 1A-1B, the drive transistors PD1 and PD2 are each constructed of two nanosheet FETs. Specifically, the drive transistor PD1 is constructed of transistors PD11 and PD12, and the drive transistor PD2 is constructed of transistors PD21 and PD22.

As shown in FIG. 5B, nanosheets 23a, 23b, 26a, and 26b extending in the X and Y directions are formed. The nanosheets 26a, 26b, 23a, and 23b constitute the channel portions of the transistors PD11, PD12, PD21, and PD22, respectively.

The nanosheets 21, 22, 23a, 23b, and 24 are arranged in this order in the X direction, and the nanosheets 25, 26a, 26b, 27, and 28 are arranged in this order in the X direction. The width of the nanosheets 23a, 23b, 26a, and 26b is double the width of the nanosheets 22 and 27 in the X direction.

The gate interconnect 32 overlaps the nanosheets 22 as viewed in plan, and the gate interconnect 33 overlaps the nanosheets 23a and 23b as viewed in plan. The gate interconnect 36 overlaps the nanosheets 26a and 26b as viewed in plan, and the gate interconnect 37 overlaps the nanosheets 27 as viewed in plan. In FIGS. 5A-5B, the gate interconnect 32 is to be the gate of the load transistor PU2, and the gate interconnect 33 is to be the gates of the transistors PD21 and PD22. The gate interconnect 36 is to be the gates of the transistors PD11 and PD12, and the gate interconnect 37 is to be the gate of the load transistor PU1.

Pads 404a, 405a, 404b, 405b, 406a, 407a, 406b, and 407b doped with an n-type semiconductor are formed at the upper end of the nanosheets 26a, at the lower end of the nanosheets 26a, at the upper end of the nanosheets 26b, at the lower end of the nanosheets 26b, at the upper end of the nanosheets 23a, at the lower end of the nanosheets 23a, at the upper end of the nanosheets 23b, and at the lower end of the nanosheets 23b, respectively, as viewed in the figure. The pads 404a and 405a constitute the nodes of the transistor PD11, the pads 404b and 405b constitute the nodes of the transistor PD12, the pads 406a and 407a constitute the nodes of the transistor PD21, and the pads 406b and 407b constitute the nodes of the transistor PD22.

That is, in FIGS. 5A-5B, the transistor PD11 is constituted by the nanosheets 26a, the gate interconnect 36, and the pads 404a and 405a. The transistor PD12 is constituted by the nanosheets 26b, the gate interconnect 36, and the pads 404b and 405b. The transistor PD21 is constituted by the nanosheets 23a, the gate interconnect 33, and the pads 406a and 407a. The transistor PD22 is constituted by the nanosheets 23b, the gate interconnect 33, and the pads 406b and 407b.

The local interconnect 52 is connected with the pads 406a and 406b, the local interconnect 54 is connected with the pads 402, 404a, 404b, and 413, the local interconnect 55 is connected with the pads 412, 407a, 407b, and 409, and the local interconnect 57 is connected with the pads 405a and 405b.

In FIGS. 5A-5B, portions of the peripheries of the nanosheets 21, 22, 23a, 23b, 24, 25, 26a, 26b, 27, and 28 in the X and Z directions are exposed, not covered with the gate interconnects.

More specifically, the right side faces of the nanosheets 21, 22, 23b, 25, and 26b are exposed, not covered with the gate interconnects 30, 32, 33, 35, and 36, respectively. The left side faces of the nanosheets 23a, 24, 26a, 27, and 28 are exposed, not covered with the gate interconnects 33, 34, 36, 37, and 39, respectively.

That is, the faces of the nanosheets 22 and 23a opposed to each other in the X direction are exposed from the gate interconnects 32 and 33, respectively. The faces of the nanosheets 23b and 24 opposed to each other in the X direction are exposed from the gate interconnects 33 and 34, respectively. The faces of the nanosheets 25 and 26a opposed to each other in the X direction are exposed from the gate interconnects 35 and 36, respectively. The faces of the nanosheets 26b and 27 opposed to each other in the X direction are exposed from the gate interconnects 36 and 37, respectively.

According to the layout structure of FIGS. 5A-5B, the faces of the nanosheets 22 and 23a opposed to each other in the X direction are exposed from the gate interconnects 32 and 33, the faces of the nanosheets 23b and 24 opposed to each other in the X direction are exposed from the gate interconnects 33 and 34, the faces of the nanosheets 25 and 26a opposed to each other in the X direction are exposed from the gate interconnects 35 and 36, and the faces of the nanosheets 26b and 27 opposed to each other in the X direction are exposed from the gate interconnects 36 and 37. This can reduce the distance d1 between the load transistor PU2 and the transistor PD21, between the transistor PD22 and the access transistor PG4, between the access transistor PG1 and the transistor PD11, and between the transistor PD12 and the load transistor PU1, in the X direction, whereby reduction in the area of the semiconductor storage device can be achieved.

Also, the width of the nanosheets 23a, 23b, 26a, and 26b in the X direction is double the width of the nanosheets 22 and 27 in the X direction. This can reduce the width of the nanosheets constituting the drive transistors PD1 and PD2 in the X direction, and thus can improve the manufacture easiness of the semiconductor storage device.

In addition, similar effects to those obtained in the configuration of FIGS. 1A-1B can be obtained.

While two-port SRAM cells inverted in the X direction are placed on the left and right sides of the two-port SRAM cell of FIGS. 5A-5B, the configuration is not limited to this. Instead, two-port SRAM cells non-inverted in the X direction may be placed on the left and right sides of the two-port SRAM cell of FIGS. 5A-5B.

Alteration 2

Figure 6A:
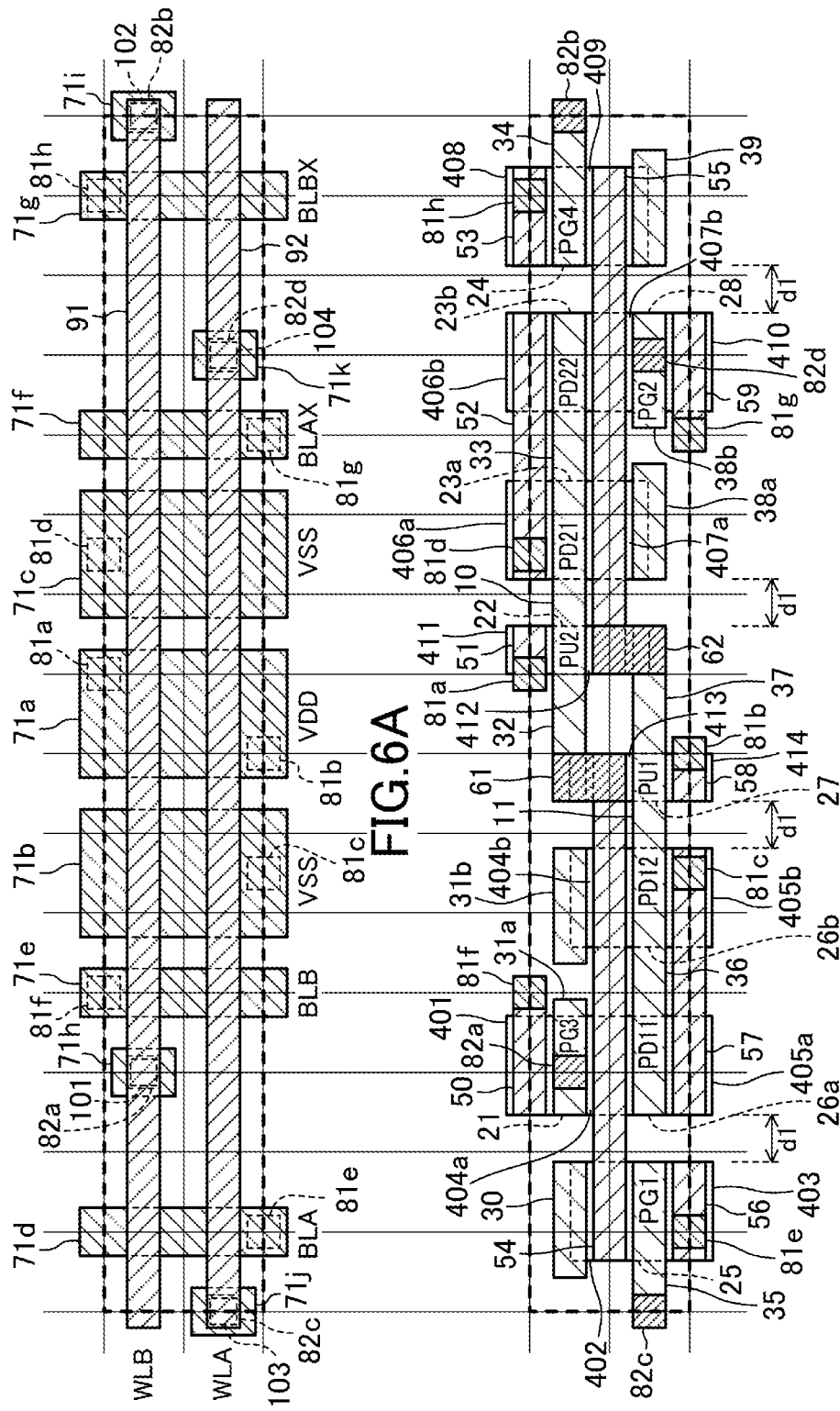
FIGS. 6A-6B are plan views showing yet another example of the layout structure of the two-port SRAM cell according to the first embodiment.
Figure 6B:
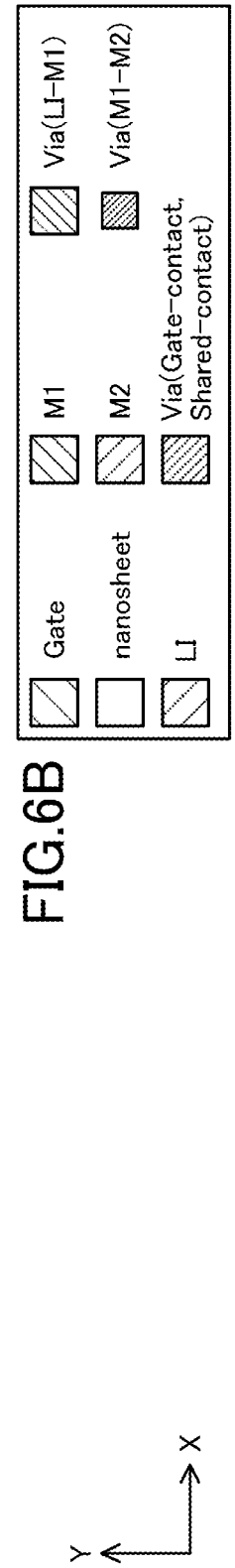

FIGS. 6A-6B are plan views showing yet another example of the layout structure of the two-port SRAM cell according to the first embodiment. Specifically, FIG. 6A shows an upper part of the cell, and FIG. 6B shows a lower part of the cell. In FIGS. 6A-6B, in comparison with FIGS. 5A-5B, the placement of the access transistors PG2 and PG3 and the interconnects 71e and 71f is different. Specifically, the access transistor PG2 is displaced leftward from the position in FIGS. 5A-5B, and the access transistor PG3 is displaced rightward from the position in FIGS. 5A-5B. Also, the interconnects 71e and 71f are placed away from the interconnects 71d and 71g, respectively, in the X direction.

As shown in FIG. 6B, the nanosheets 21 are formed on the upper side of the pad 404a in the figure and connected with the pad 404a. The nanosheets 28 are formed on the lower side of the pad 407b in the figure and connected with the pad 407b. The pad 401 is formed on the upper side of the nanosheets 21 in the figure. The pad 410 is formed on the lower side of the nanosheets 28 in the figure.

In FIGS. 6A-6B, the nanosheets 21 and 26a are formed side by side in the Y direction, and the nanosheets 23b and 28 are formed side by side in the Y direction.

Gate interconnects 31a and 31b extending in the X and Z directions are formed between the gate interconnects 30 and 32. Gate interconnects 38a and 38b extending in the X and Z directions are formed between the gate interconnects 37 and 39.

The gate interconnect 31a overlaps the nanosheets 21 as viewed in plan, and the gate interconnect 38b overlaps the nanosheets 28 as viewed in plan. In FIGS. 6A-6B, the gate interconnect 31a is to be the gate of the access transistor PG3, and the gate interconnect 38b is to be the gate of the access transistor PG2.

In FIGS. 6A-6B, the access transistor PG3 is constituted by the nanosheets 21, the gate interconnect 31a, and the pads 401 and 404a. The access transistor PG2 is constituted by the nanosheets 28, the gate interconnect 38b, and the pads 407b and 410.

As shown in FIG. 6A, the interconnect 71d that is the first bit line BLA and the interconnect 71e that is the third bit line BLB are placed away from each other in the X direction. The interconnect 71f that is the second bit line BLAX and the interconnect 71g that is the fourth bit line BLBX are placed away from each other in the X direction. The interconnects 71a to 71c are placed close to each other.

Also, the interconnect 71h is placed between the interconnects 71d and 71e, and the interconnect 71k is placed between the interconnects 71f and 71g. The interconnect 71h is connected with the gate interconnect 31a through the contact 82a, and the interconnect 71k is connected with the gate interconnect 38b through the contact 82d.

In FIGS. 6A-6B, the left side faces of the nanosheets 21 in the figure are exposed, not covered with the gate interconnect 31a. The right side faces of the nanosheets 28 in the figure are exposed, not covered with the gate interconnect 38b.

According to the layout structure of FIGS. 6A-6B, since the spacing between the first bit line BLA and the third bit line BLB and the spacing between the second bit line BLAX and the fourth bit line BLBX are widened, the coupling capacitance between bit lines is reduced. This prevents noise caused by the inter-bit-line coupling capacitance, and thus permits speedups of write operation and read operation into and from the two-port SRAM cell.

Also, similar effects to those obtained in the configuration of FIGS. 5A-5B can be obtained.

Alteration 3

Figures 7A, 7B:
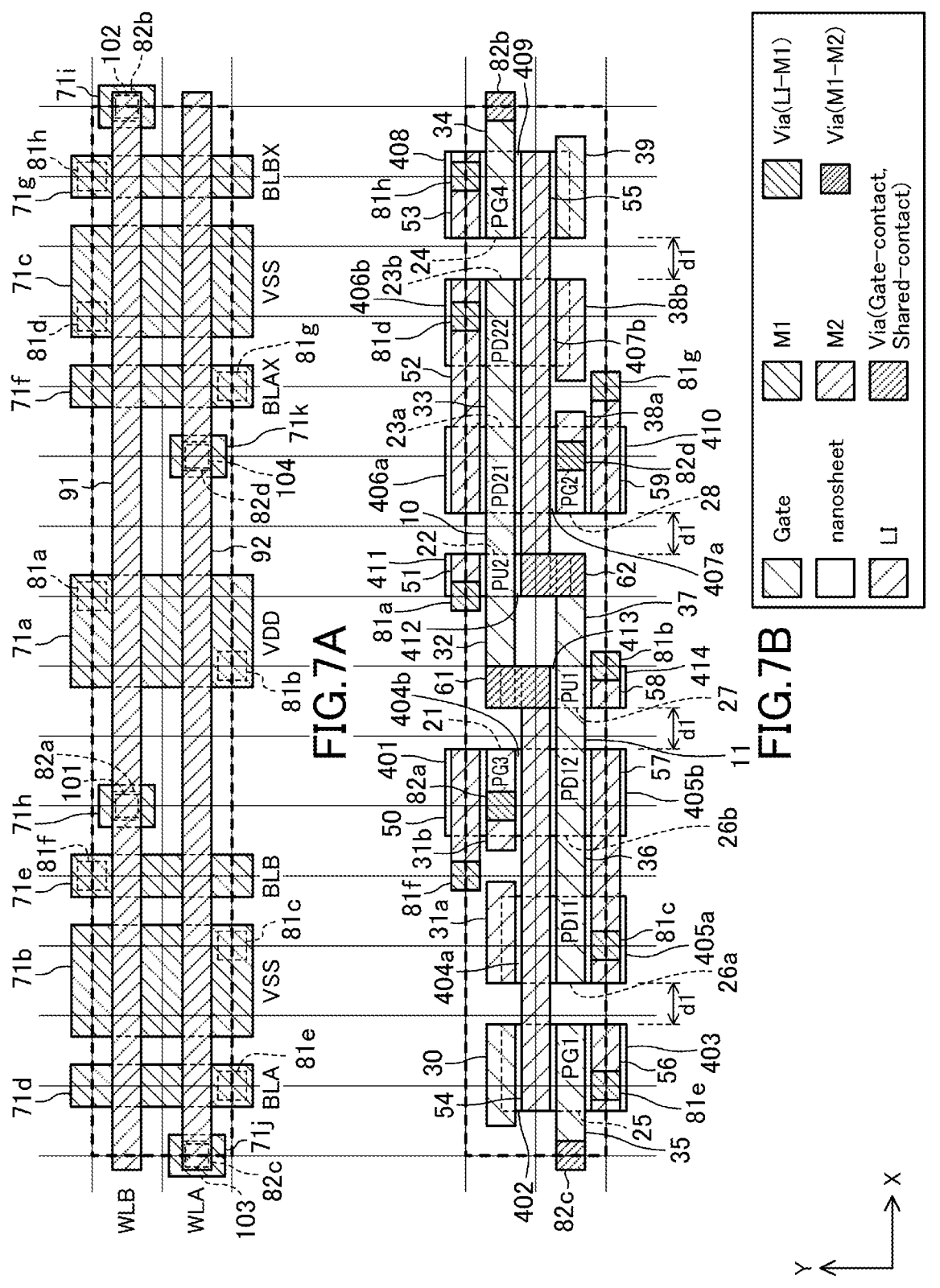

FIGS. 7A-7B are plan views showing yet another example of the layout structure of the two-port SRAM cell according to the first embodiment. Specifically, FIG. 7A shows an upper part of the cell, and FIG. 7B shows a lower part of the cell. In FIGS. 7A-7B, in comparison with FIGS. 6A-6B, the placement of the access transistors PG2 and PG3 and the interconnects 71b, 71c, 71e, and 71f is different. Specifically, the access transistor PG2 is displaced leftward from the position in FIGS. 6A-6B, and the access transistor PG3 is displaced rightward from the position in FIG. 6A-6B. Also, the interconnect 71b is placed between the interconnects 71d and 71e, and the interconnect 71c is placed between the interconnects 71f and 71g.

As shown in FIG. 7B, the nanosheets 21 are formed on the upper side of the pad 404b in the figure and connected with the pad 404b. The nanosheets 28 are formed on the lower side of the pad 407a in the figure and connected with the pad 407a. The pad 401 is formed on the upper side of the nanosheets 21 in the figure. The pad 410 is formed on the lower side of the nanosheets 28 in the figure.

In FIGS. 7A-7B, the nanosheets 21 and 26b are formed side by side in the Y direction, and the nanosheets 23a and 28 are formed side by side in the Y direction.

The gate interconnect 31b overlaps the nanosheets 21 as viewed in plan, and the gate interconnect 38a overlaps the nanosheets 28 as viewed in plan. In FIGS. 7A-7B, the gate interconnect 31b is to be the gate of the access transistor PG3, and the gate interconnect 38a is to be the gate of the access transistor PG2.

In FIGS. 7A-7B, the access transistor PG3 is constituted by the nanosheets 21, the gate interconnect 31b, and the pads 401 and 404b. The access transistor PG2 is constituted by the nanosheets 28, the gate interconnect 38a, and the pads 407a and 410.

As shown in FIG. 7A, the interconnect 71b supplying VSS is placed between the interconnect 71d that is the first bit line BLA and the interconnect 71e that is the third bit line BLB. The interconnect 71c supplying VSS is placed between the interconnect 71f that is the second bit line BLAX and the interconnect 71g that is the fourth bit line BLBX.

Also, the interconnect 71h is placed between the interconnects 71a and 71e, and the interconnect 71k is placed between the interconnects 71a and 71f. The interconnect 71h is connected with the gate interconnect 31b through the contact 82a, and the interconnect 71k is connected with the gate interconnect 38a through the contact 82d.

In FIGS. 7A-7B, the right side faces of the nanosheets 21 in the figure are exposed, not covered with the gate interconnect 31b. The left side faces of the nanosheets 28 in the figure are exposed, not covered with the gate interconnect 38a.

According to the layout structure of FIGS. 7A-7B, since a VSS line is interposed between the first bit line BLA and the third bit line BLB and between the second bit line BLAX and the fourth bit line BLBX, the coupling capacitance between bit lines is reduced. This prevents noise caused by the inter-bit-line coupling capacitance, and thus permits speedups of write operation and read operation into and from the two-port SRAM cell.

Also, similar effects to those obtained in the configuration of FIGS. 6A-6B can be obtained.

Alteration 4

Figures 8A, 8B:
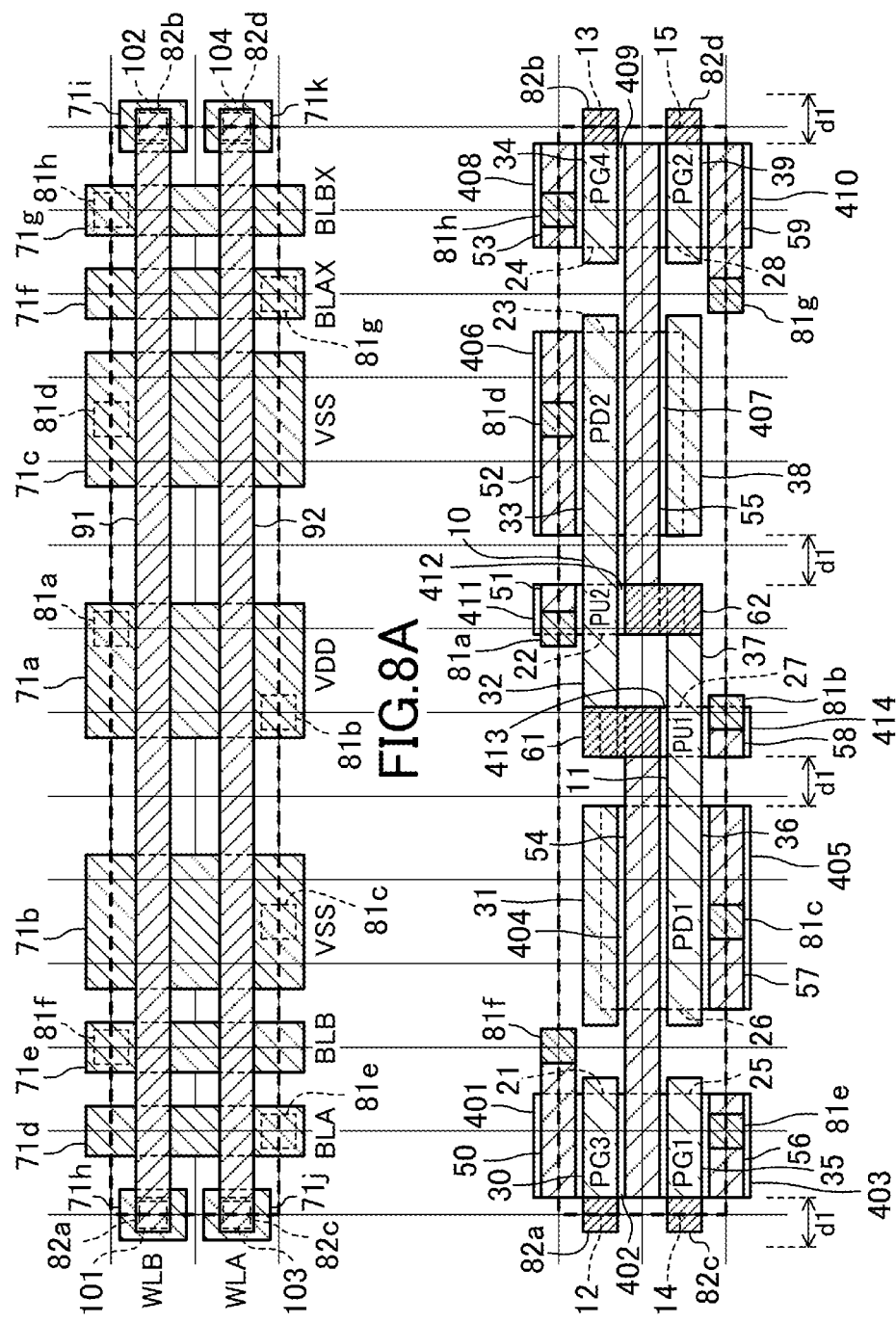
FIGS. 8A-8B are plan views showing yet another example of the layout structure of the two-port SRAM cell according to the first embodiment.

FIGS. 8A-8B are plan views showing yet another example of the layout structure of the two-port SRAM cell according to the first embodiment. Specifically, FIG. 8A shows an upper part of the cell, and FIG. 8B shows a lower part of the cell. In FIGS. 8A-8B, the faces of the nanosheets opposite to the faces in the case of FIGS. 1A-1B in the X direction are exposed from the gate interconnects.

As shown in FIG. 8B, the gate interconnects 32, 33, 36, and 37 overlap the nanosheets 22, 23, 26, and 27, respectively, as viewed in plan. In FIGS. 8A-8B, the gate interconnect 32 is to be the gate of the load transistor PU2, and the gate interconnect 33 is to be the gate of the drive transistor PD2. The gate interconnect 36 is to be the gate of the drive transistor PD1, and the gate interconnect 37 is to be the gate of the load transistor PU1.

Also, the gate interconnects 30 and 35 are respectively connected with gate interconnects 30 and 35 of a two-port SRAM cell placed on the left side of the subject two-port SRAM cell in the figure through bridges 12 and 14 extending in the X direction. The gate interconnects 34 and 39 are respectively connected with gate interconnects 34 and 39 of a two-port SRAM cell placed on the right side of the subject two-port SRAM cell in the figure through bridges 13 and 15 extending in the X direction.

The interconnect 71h is connected with the gate interconnect 30 through the contact 82a and the bridge 12. The interconnect 71i is connected with the gate interconnect 34 through the contact 82b and the bridge 13. The interconnect 71j is connected with the gate interconnect 35 through the contact 82c and the bridge 14. The interconnect 71k is connected with the gate interconnect 39 through the contact 82d and the bridge 15.

In FIGS. 8A-8B, the left side faces of the nanosheets 21, 23, 25, and 27 are exposed, not covered with the gate interconnects 30, 33, 35, and 37, respectively. The right side faces of the nanosheets 22, 24, 26, and 28 are exposed, not covered with the gate interconnects 32, 34, 36, and 39, respectively.

That is, the faces of the nanosheets 22 and 23 opposed to each other in the X direction are exposed from the gate interconnects 32 and 33, respectively. The faces of the nanosheets 26 and 27 opposed to each other in the X direction are exposed from the gate interconnects 36 and 37, respectively.

Also, the nanosheets 21 and 25 are formed close to the cell boundary on the left side in the figure, and the nanosheets 24 and 28 are formed close to the cell boundary on the right side in the figure. A two-port SRAM cell inverted in the X direction is placed on each of the left and right sides of the two-port SRAM cell of FIGS. 8A-8B. That is, in the two-port SRAM cells arranged in the X direction, the faces of the nanosheets 21 of the adjacent cells opposed to each other in the X direction are exposed from the gate interconnects 30. The faces of the nanosheets 24 of the adjacent cells opposed to each other in the X direction are exposed from the gate interconnects 34. The faces of the nanosheets 25 of the adjacent cells opposed to each other in the X direction are exposed from the gate interconnects 35. The faces of the nanosheets 28 of the adjacent cells opposed to each other in the X direction are exposed from the gate interconnects 39.

According to the layout structure of FIGS. 8A-8B, the faces of the nanosheets 22 and 23 opposed to each other in the X direction are exposed from the gate interconnects 32 and 33, and the faces of the nanosheets 26 and 27 opposed to each other in the X direction are exposed from the gate interconnects 36 and 37. This can reduce the distance d1 between the load transistor PU2 and the drive transistor PD2 and between the drive transistor PD1 and the load transistor PU1 in the X direction, whereby reduction in the area of the semiconductor storage device can be achieved.

Also, in the two-port SRAM cells arranged in the X direction, the faces of the nanosheets 21 opposed to each other are exposed from the gate interconnects 30, the faces of the nanosheets 24 opposed to each other are exposed from the gate interconnects 34, the faces of the nanosheets 25 opposed to each other are exposed from the gate interconnects 35, and the faces of the nanosheets 28 opposed to each other are exposed from the gate interconnects 39. This can reduce the distance d1 between the adjacent access transistors PG3, between the adjacent access transistors PG4, between the adjacent access transistors PG1, and between the adjacent access transistors PG2, in the X direction, whereby reduction in the area of the semiconductor storage device can be achieved.

Also, similar effects to those obtained in the configuration of FIGS. 1A-1B can be obtained.

While two-port SRAM cells inverted in the X direction are placed on the left and right sides of the two-port SRAM cell of FIGS. 8A-8B, the configuration is not limited to this. Instead, two-port SRAM cells non-inverted in the X direction may be placed on the left and right sides of the two-port SRAM cell of FIGS. 8A-8B.

Alteration 5

Figures 9A, 9B:
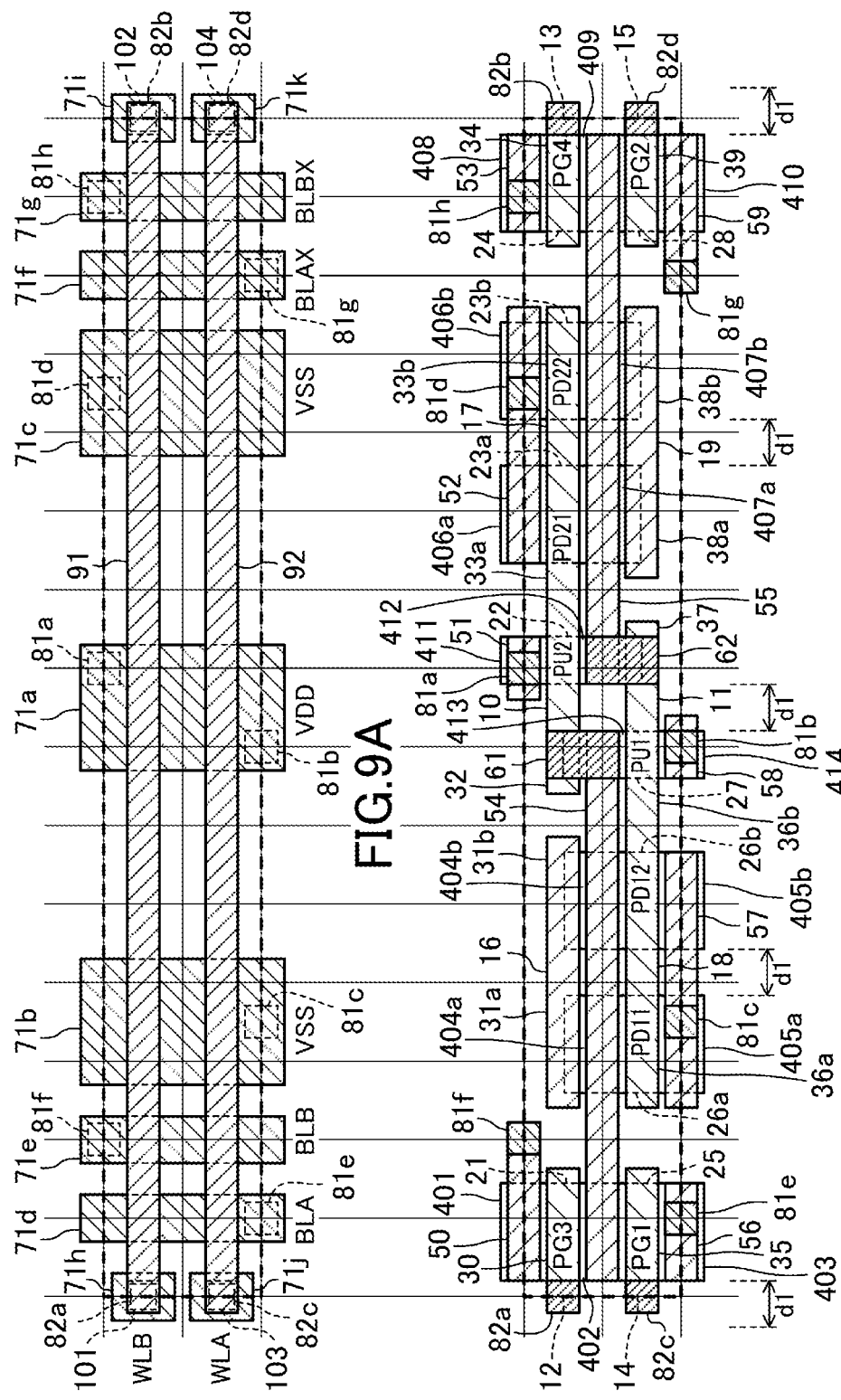
FIGS. 9A-9B are plan views showing yet another example of the layout structure of the two-port SRAM cell according to the first embodiment.

FIGS. 9A-9B are plan views showing yet another example of the layout structure of the two-port SRAM cell according to the first embodiment. Specifically, FIG. 9A shows an upper part of the cell, and FIG. 9B shows a lower part of the cell. In FIGS. 9A-9B, in comparison with FIGS. 8A-8B, the drive transistors PD1 and PD2 are each constructed of two nanosheet FETs. Specifically, the drive transistor PD1 is constructed of transistors PD11 and PD12, and the drive transistor PD2 is constructed of transistors PD21 and PD22.

As shown in FIG. 9B, the nanosheets 23a, 23b, 26a, and 26b are formed. In FIGS. 9A-9B, the nanosheets 26a, 26b, 23a, and 23b constitute the channel portions of the transistors PD11, PD12, PD21, and PD22, respectively.

The nanosheets 21, 22, 23a, 23b, and 24 are arranged in this order in the X direction, and the nanosheets 25, 26a, 26b, 27, and 28 are arranged in this order in the X direction. The width of the nanosheets 23a, 23b, 26a, and 26b is double the width of the nanosheets 22 and 27 in the X direction.

The gate interconnects 31a and 31b extending in the X and Z directions are formed between the gate interconnects 30 and 32. Gate interconnects 33a and 33b extending in the X and Z directions are formed between the gate interconnects 32 and 34. Gate interconnects 36a and 36b extending in the X and Z directions are formed between the gate interconnects 35 and 37. The gate interconnects 38a and 38b extending in the X and Z directions are formed between the gate interconnects 37 and 39.

The gate interconnect 33a overlaps the nanosheets 22 and 23a as viewed in plan, the gate interconnect 33b overlaps the nanosheets 23b as viewed in plan, the gate interconnect 36a overlaps the nanosheets 26a as viewed in plan, and the gate interconnect 36b overlaps the nanosheets 26b and 27 as viewed in plan. In FIGS. 9A-9B, the gate interconnect 33a is to be the gates of the load transistor PU2 and the transistor PD21, and the gate interconnect 33b is to be the gate of the transistor PD22. The gate interconnect 36a is to be the gate of the transistor PD11, and the gate interconnect 36b is to be the gates of the transistor PD12 and the load transistor PU1.

The gate interconnects 31a and 31b are mutually connected through a bridge 16 extending in the X direction. The gate interconnects 32 and 33a are mutually connected through the bridge 10. The gate interconnects 33a and 33b are mutually connected through a bridge 17 extending in the X direction. The gate interconnects 36a and 36b are mutually connected through a bridge 18 extending in the X direction. The gate interconnects 36b and 37 are mutually connected through the bridge 11. The gate interconnects 38a and 38b are mutually connected through a bridge 19 extending in the X direction.

In FIGS. 9A-9B, the pads 404a and 405a constitute the nodes of the transistor PD11, the pads 404b and 405b constitute the nodes of the transistor PD12, the pads 406a and 407a constitute the nodes of the transistor PD21, and the pads 406b and 407b constitute the nodes of the transistor PD22.

In FIGS. 9A-9B, the right side faces of the nanosheets 23a, 26a, and 27 are exposed, not covered with the gate interconnects 33a, 36a, and 36b, respectively. The left side faces of the nanosheets 22, 23b, and 26b are exposed, not covered with the gate interconnects 33a, 33b, and 36b, respectively. That is, the faces of the nanosheets 23a and 23b opposed to each other in the X direction are exposed from the gate interconnects 33a and 33b, respectively. The faces of the nanosheets 26a and 26b opposed to each other in the X direction are exposed from the gate interconnects 36a and 36b, respectively.

Also, the nanosheets 22 are formed at the upper right of the nanosheets 27 as viewed in plan. That is, the faces of the nanosheets 22 and 27 opposed to each other in the X direction are exposed from the gate interconnects 33a and 36b, respectively.

According to the layout structure of FIGS. 9A-9B, the faces of the nanosheets 23a and 23b opposed to each other in the X direction are exposed from the gate interconnects 33a and 33b, and the faces of the nanosheets 26a and 26b opposed to each other in the X direction are exposed from the gate interconnects 36a and 36b. This can reduce the distance d1 between the transistors PD21 and PD22 and between the transistors PD11 and PD12 in the X direction, whereby reduction in the area of the semiconductor storage device can be achieved.

Also, the faces of the nanosheets 22 and 27 opposed to each other in the X direction are exposed from the gate interconnects 33a and 36b. This can reduce the distance d1 between the load transistors PU1 and PU2 in the X direction, whereby reduction in the area of the semiconductor storage device can be achieved.

The width of the nanosheets 23a, 23b, 26a, and 26b in the X direction is double the width of the nanosheets 22 and 27 in the X direction. This can reduce the width of the nanosheets constituting the drive transistors PD1 and PD2 in the X direction, and thus can improve the manufacture easiness of the semiconductor storage device.

Also, similar effects to those obtained in the configuration of FIGS. 8A-8B can be obtained.

While two-port SRAM cells inverted in the X direction are placed on the left and right sides of the two-port SRAM cell of FIGS. 9A-9B, the configuration is not limited to this. Instead, two-port SRAM cells non-inverted in the X direction may be placed on the left and right sides of the two-port SRAM cell of FIGS. 9A-9B.

Alteration 6

Figures 10A, 10B:
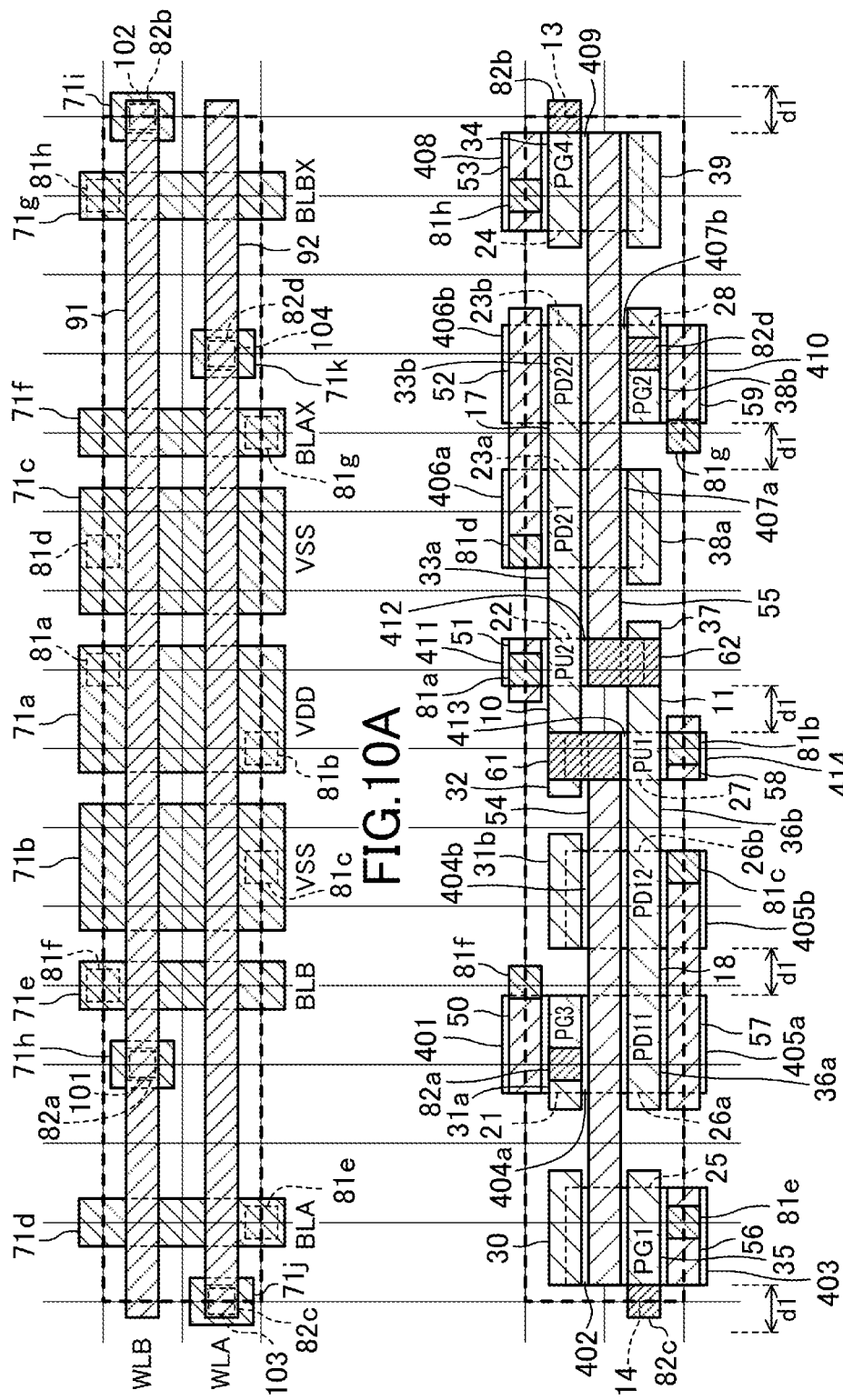
FIGS. 10A-10B are plan views showing yet another example of the layout structure of the two-port SRAM cell according to the first embodiment.

FIGS. 10A-10B are plan views showing yet another example of the layout structure of the two-port SRAM cell according to the first embodiment. Specifically, FIG. 10A shows an upper part of the cell, and FIG. 10B shows a lower part of the cell. In FIGS. 10A-10B, in comparison with FIGS. 9A-9B, the placement of the access transistors PG2 and PG3 and the interconnects 71e and 71f is different. Specifically, the access transistor PG2 is displaced leftward from the position in FIGS. 9A-9B, and the access transistor PG3 is displaced rightward from the position in FIGS. 9A-9B. Also, the interconnects 71e and 71f are placed away from the interconnects 71d and 71g, respectively, in the X direction. Note that the bridges 16 and 19 are omitted.

As shown in FIG. 10B, the nanosheets 21 are formed on the upper side of the pad 404a in the figure and connected with the pad 404a. The nanosheets 28 are formed on the lower side of the pad 407b in the figure and connected with the pad 407b. The pad 401 is formed on the upper side of the nanosheets 21 in the figure. The pad 410 is formed on the lower side of the nanosheets 28 in the figure.

In FIGS. 10A-10B, the nanosheets 21 and 26a are formed side by side in the Y direction, and the nanosheets 23b and 28 are formed side by side in the Y direction.

The gate interconnect 31a overlaps the nanosheets 21 as viewed in plan, and the gate interconnect 38b overlaps the nanosheets 28 as viewed in plan. In FIGS. 10A-10B, the gate interconnect 31a is to be the gate of the access transistor PG3, and the gate interconnect 38b is to be the gate of the access transistor PG2.

In FIGS. 10A-10B, the access transistor PG3 is constituted by the nanosheets 21, the gate interconnect 31a, and the pads 401 and 404a. The access transistor PG2 is constituted by the nanosheets 28, the gate interconnect 38b, and the pads 407b and 410.

As shown in FIG. 10A, the interconnect 71d that is the first bit line BLA and the interconnect 71e that is the third bit line BLB are placed away from each other in the X direction. The interconnect 71f that is the second bit line BLAX and the interconnect 71g that is the fourth bit line BLBX are placed away from each other in the X direction. The interconnects 71a to 71c are placed close to each other.

Also, the interconnect 71h is placed between the interconnects 71d and 71e, and the interconnect 71k is placed between the interconnects 71f and 71g. The interconnect 71h is connected with the gate interconnect 31a through the contact 82a, and the interconnect 71k is connected with the gate interconnect 38b through the contact 82d.

In FIGS. 10A-10B, the left side faces of the nanosheets 21 in the figure are exposed, not covered with the gate interconnect 31a. The right side faces of the nanosheets 28 in the figure are exposed, not covered with the gate interconnect 38b.

According to the layout structure of FIGS. 10A-10B, since the spacing between the first bit line BLA and the third bit line BLB and the spacing between the second bit line BLAX and the fourth bit line BLBX are widened, the coupling capacitance between bit lines is reduced. This prevents noise caused by the inter-bit-line coupling capacitance, and thus permits speedups of write operation and read operation into and from the two-port SRAM cell.

Also, similar effects to those obtained in the configuration of FIGS. 9A-9B can be obtained.

Alteration 7

FIGS. 11A-11B are plan views showing yet another example of the layout structure of the two-port SRAM cell according to the first embodiment. Specifically, FIG. 11A shows an upper part of the cell, and FIG. 11B shows a lower part of the cell. In FIGS. 11A-11B, in comparison with FIGS. 10A-10B, the placement of the access transistors PG2 and PG3 and the interconnects 71b, 71c, 71e, and 71f is different. Specifically, the access transistor PG2 is displaced leftward from the position in FIGS. 10A-10B, and the access transistor PG3 is displaced rightward from the position in FIG. 10A-10B. Also, the interconnect 71b is placed between the interconnects 71d and 71e, and the interconnect 71c is placed between the interconnects 71f and 71g.

As shown in FIG. 11B, the nanosheets 21 are formed on the upper side of the pad 404b in the figure and connected with the pad 404b. The nanosheets 28 are formed on the lower side of the pad 407a in the figure and connected with the pad 407a. The pad 401 is formed on the upper side of the nanosheets 21 in the figure. The pad 410 is formed on the lower side of the nanosheets 28 in the figure.

In FIGS. 11A-11B, the nanosheets 21 and 26b are formed side by side in the Y direction, and the nanosheets 23a and 28 are formed side by side in the Y direction.

The gate interconnect 31b overlaps the nanosheets 21 as viewed in plan, and the gate interconnect 38a overlaps the nanosheets 28 as viewed in plan. In FIGS. 11A-11B, the gate interconnect 31b is to be the gate of the access transistor PG3, and the gate interconnect 38a is to be the gate of the access transistor PG2. Note that the gate interconnects 30 and 39 are omitted.

In FIGS. 11A-11B, the access transistor PG3 is constituted by the nanosheets 21, the gate interconnect 31b, and the pads 401 and 404b. The access transistor PG2 is constituted by the nanosheets 28, the gate interconnect 38a, and the pads 407a and 410.

As shown in FIG. 11A, the interconnect 71b supplying VSS is placed between the interconnect 71d that is the first bit line BLA and the interconnect 71e that is the third bit line BLB. The interconnect 71c supplying VSS is placed between the interconnect 71f that is the second bit line BLAX and the interconnect 71g that is the fourth bit line BLBX.

Also, the interconnect 71h is placed between the interconnects 71a and 71e, and the interconnect 71k is placed between the interconnects 71a and 71f. The interconnect 71h is connected with the gate interconnect 31b through the contact 82a, and the interconnect 71k is connected with the gate interconnect 38a through the contact 82d.

In FIGS. 11A-11B, the left side faces of the nanosheets 21 in the figure are exposed, not covered with the gate interconnect 31b. The right side faces of the nanosheets 28 in the figure are exposed, not covered with the gate interconnect 38a.

According to the layout structure of FIGS. 11A-11B, since a VSS line is interposed between the first bit line BLA and the third bit line BLB and between the second bit line BLAX and the fourth bit line BLBX, the coupling capacitance between bit lines is reduced. This prevents noise caused by the inter-bit-line coupling capacitance, and thus permits speedups of write operation and read operation into and from the two-port SRAM cell.

Also, similar effects to those obtained in the configuration of FIGS. 10A-10B can be obtained.

Second Embodiment

FIGS. 12A-12B are plan views showing an example of the layout structure of a two-port SRAM cell according to the second embodiment. Specifically, FIG. 12A shows an upper part of the cell, and FIG. 12B shows a lower part of the cell. In FIGS. 12A-12B, the two-port SRAM cell circuit of FIG. 4 is constituted by the load transistors PU1 and PU2, the drive transistor PD1 (transistors PD11 and PD12), the drive transistor PD2 (transistors PD21 and PD22), and the access transistors PG1 to PG4. A two-port SRAM cell inverted in the X direction is placed on each of the left and right sides of the two-port SRAM cell of FIGS. 12A-12B.

As shown in FIG. 12B, the nanosheets 24, 21, 22, 23a, and 23b are arranged in this order in the X direction, and the nanosheets 26a, 26b, 27, 28, and 25 are arranged in this order in the X direction.

Also, the nanosheets 21 and 26a are formed side by side in the Y direction, and the nanosheets 23b and 28 are formed side by side in the Y direction.

The gate interconnect 30 overlaps the nanosheets 24 and 21 as viewed in plan, the gate interconnect 33 overlaps the nanosheets 22 and 23a as viewed in plan, the gate interconnect 34 overlaps the nanosheets 23b as viewed in plan, the gate interconnect 35 overlaps the nanosheets 26a as viewed in plan, the gate interconnect 36 overlaps the nanosheets 26b and 27 as viewed in plan, and the gate interconnect 39 overlaps the nanosheets 28 and 25 as viewed in plan.

The gate interconnect 30 is connected with a gate interconnect 30 of a two-port SRAM cell placed on the left side of the subject two-port SRAM cell in the figure through the bridge 12. The gate interconnects 32 and 33 are mutually connected through the bridge 10. The gate interconnects 33 and 34 are mutually connected through a bridge 110 extending in the X direction. The gate interconnects 35 and 36 are mutually connected through a bridge 111 extending in the X direction. The gate interconnects 36 and 37 are mutually connected through the bridge 11. The gate interconnect 39 is connected with a gate interconnect 39 of a two-port SRAM cell placed on the right side of the subject two-port SRAM cell in the figure through the bridge 15.

In FIGS. 12A-12B, the access transistor PG4 is constituted by the nanosheets 24, the gate interconnect 30, and the pads 408 and 409. The access transistor PG3 is constituted by the nanosheets 21, the gate interconnect 30, and the pads 401 and 404a. The load transistor PU2 is constituted by the nanosheets 22, the gate interconnect 33, and the pads 411 and 412. The transistor PD21 is constituted by the nanosheets 23a, the gate interconnect 33, and the pads 406a and 407a. The transistor PD22 is constituted by the nanosheets 23b, the gate interconnect 34, and the pads 406b and 407b. The transistor PD11 is constituted by the nanosheets 26a, the gate interconnect 35, and the pads 404a and 405a. The transistor PD12 is constituted by the nanosheets 26b, the gate interconnect 36, and the pads 404b and 405b. The load transistor PU1 is constituted by the nanosheets 27, the gate interconnect 36, and the pads 413 and 414. The access transistor PG2 is constituted by the nanosheets 28, the gate interconnect 39, and the pads 407b and 410. The access transistor PG1 is constituted by the nanosheets 25, the gate interconnect 39, and the pads 402 and 403.

Thus, the access transistors PG4 and PG3, the load transistor PU2, and the transistors PD21 and PD22 are formed in line in the X direction. The transistors PD11 and PD12, the load transistor PU1, and the access transistors PG2 and PG1 are formed in line in the X direction. Also, the access transistor PG3 and the transistor PD11 are formed side by side in the Y direction, and the transistor PD22 and the access transistor PG2 are formed side by side in the Y direction.

In the local interconnect layer, local interconnects 150 and 151 extending in the X direction are formed. The local interconnect 150 is connected with the pad 402 and also connected with the gate interconnect 34 through a shared contact 63. The local interconnect 151 is connected with the pad 409 and also connected with the gate interconnect 35 through a shared contact 64. In FIGS. 12A-12B, the gate interconnects 32, 33, and 34, the bridges 10 and 110, the local interconnects 54 and 150, and the shared contacts 61 and 63 correspond to the first node NA. The gate interconnects 35, 36, and 37, the bridges 11 and 111, the local interconnects 55 and 151, and the shared contacts 62 and 64 correspond to the second node NB.

As shown in FIG. 12A, on the left side in the figure, the interconnect 71g that is the fourth bit line BLBX and the interconnect 71e that is the third bit line BLB are placed away from each other in the X direction. On the right side in the figure, the interconnect 71f that is the second bit line BLAX and the interconnect 71d that is the first bit line BLA are placed away from each other in the X direction. That is, the complementary third and fourth bit lines BLB and BLBX are placed on the left side in the figure, and the complementary first and second bit lines BLA and BLAX are placed on the right side in the figure.

The right side faces of the nanosheets 21, 23a, 26a, 27, and 25 are exposed, not covered with the gate interconnects 30, 33, 35, 36, and 39, respectively. The left side faces of the nanosheets 24, 22, 23b, 26b, and 28 are exposed, not covered with the gate interconnects 30, 33, 34, 36, and 39, respectively.

That is, the faces of the nanosheets 23a and 23b opposed to each other in the X direction are exposed from the gate interconnects 33 and 34, respectively. The faces of the nanosheets 26a and 26b opposed to each other in the X direction are exposed from the gate interconnects 35 and 36, respectively.

Also, the nanosheets 22 are formed at the upper right of the nanosheets 27 as viewed in plan. That is, the faces of the nanosheets 22 and 27 opposed to each other in the X direction are exposed from the gate interconnects 33 and 36, respectively.

Moreover, the nanosheets 24 are formed close to the cell boundary on the left side in the figure, and the nanosheets 25 are formed close to the cell boundary on the right side in the figure. A two-port SRAM cell inverted in the X direction is placed on each of the left and right sides of the two-port SRAM cell of FIGS. 12A-12B. That is, in the two-port SRAM cells arranged in the X direction, the faces of the nanosheets 24 of the adjacent cells opposed to each other in the X direction are exposed from the gate interconnects 30. The faces of the nanosheets 25 of the adjacent cells opposed to each other in the X direction are exposed from the gate interconnects 39.

With the above configuration, the faces of the nanosheets 23a and 23b opposed to each other in the X direction are exposed from the gate interconnects 33 and 34, and the faces of the nanosheets 26a and 26b opposed to each other in the X direction are exposed from the gate interconnects 35 and 36. This can reduce the distance d1 between the transistors PD21 and PD22 and between the transistors PD11 and PD12, in the X direction, whereby reduction in the area of the semiconductor storage device can be achieved.

Also, the faces of the nanosheets 22 and 27 opposed to each other in the X direction are exposed from the gate interconnects 33 and 36. This can reduce the distance d1 between the load transistors PU1 and PU2 in the X direction, whereby reduction in the area of the semiconductor storage device can be achieved.

Moreover, in the two-port SRAM cells arranged in the X direction, the faces of the nanosheets 24 opposed to each other in the X direction are exposed from the gate interconnects 30, and the faces of the nanosheets 25 opposed to each other in the X direction are exposed from the gate interconnects 39. This can reduce the distance d1 between the adjacent access transistors PG4 and between the adjacent access transistors PG1 in the X direction, whereby reduction in the area of the semiconductor storage device can be achieved.

Further, since the spacing between the first bit line BLA and the second bit line BLA and the spacing between the third bit line BLB and the fourth bit line BLBX are widened, the coupling capacitance between bit lines is reduced. This prevents noise caused by the inter-bit-line coupling capacitance, and thus permits speedups of write operation and read operation into and from the two-port SRAM cell.

Note that a shield interconnect (an interconnect connected to VDD or VSS) extending in the Y direction may be placed between the interconnects 71g and 71e and between the interconnects 71f and 71d.

Alteration 1

FIGS. 13A-13B are plan views showing another example of the layout structure of the two-port SRAM cell according to the second embodiment. Specifically, FIG. 13A shows an upper part of the cell, and FIG. 13B shows a lower part of the cell. In FIGS. 13A-13B, in comparison with FIGS. 12A-12B, the placement of the access transistors PG2 and PG3 and the interconnects 71b, 71c, 71e, and 71f is different. Specifically, the access transistor PG2 is displaced leftward from the position in FIGS. 12A-12B, and the access transistor PG3 is displaced rightward from the position in FIGS. 12A-12B. Also, the interconnect 71b is placed between the interconnects 71g and 71e, and the interconnect 71c is placed between the interconnects 71f and 71d.

As shown in FIG. 13B, the nanosheets 21 are formed on the upper side of the pad 404b in the figure and connected with the pad 404b. The nanosheets 28 are formed on the lower side of the pad 407a in the figure and connected with the pad 407a. The pad 401 is formed on the upper side of the nanosheets 21 in the figure. The pad 410 is formed on the lower side of the nanosheets 28 in the figure.

In FIGS. 13A-13B, the nanosheets 21 and 26b are formed side by side in the Y direction, and the nanosheets 23a and 28 are formed side by side in the Y direction.

The gate interconnect 31 overlaps the nanosheets 21 as viewed in plan, and the gate interconnect 38 overlaps the nanosheets 28 as viewed in plan. In FIGS. 13A-13B, the gate interconnect 31 is to be the gate of the access transistor PG3, and the gate interconnect 38 is to be the gate of the access transistor PG2.

The gate interconnects 30 and 31 are mutually connected through a bridge 112, and the gate interconnects 38 and 39 are mutually connected through a bridge 113.

That is, in FIGS. 13A-13B, the access transistor PG3 is constituted by the nanosheets 21, the gate interconnect 31, and the pads 401 and 404b. The access transistor PG2 is constituted by the nanosheets 28, the gate interconnect 38, and the pads 407a and 410.

As shown in FIG. 13A, the interconnect 71b supplying VSS is formed between the interconnect 71g that is the fourth bit line BLBX and the interconnect 71e that is the third bit line BLB. The interconnect 71c supplying VSS is formed between the interconnect 71f that is the second bit line BLAX and the interconnect 71d that is the first bit line BLA.

In FIGS. 13A-13B, the left side faces of the nanosheets 21 in the figure are exposed, not covered with the gate interconnect 31. The right side faces of the nanosheets 28 in the figure are exposed, not covered with the gate interconnect 38.

According to the layout structure of FIGS. 13A-13B, since a VSS line is interposed between the first bit line BLA and the second bit line BLAX and between the third bit line BLB and the fourth bit line BLBX, the coupling capacitance between bit lines is reduced. This prevents noise caused by the inter-bit-line coupling capacitance, and thus permits speedups of write operation and read operation into and from the two-port SRAM cell.

Also, similar effects to those obtained in the configuration of FIGS. 12A-12B can be obtained.

Alteration 2

FIGS. 14A-14B are plan views showing yet another example of the layout structure of the two-port SRAM cell according to the second embodiment. Specifically, FIG. 14A shows an upper part of the cell, and FIG. 14B shows a lower part of the cell. In FIGS. 14A-14B, in comparison with FIGS. 12A-12B, the faces of the nanosheets opposite to the faces in the case of FIGS. 12A-12B in the X direction are exposed from the gate interconnects.

As shown in FIG. 14B, gate interconnects 30a and 30b extending in the X and Z directions are formed on the left side of the gate interconnect 31 in the figure, and gate interconnects 39a and 39b extending in the X and Z directions are formed on the right side of the gate interconnect 38 in the figure.

The gate interconnect 30a overlaps the nanosheets 24 as viewed in plan, the gate interconnect 30b overlaps the nanosheets 21 as viewed in plan, the gate interconnect 32 overlaps the nanosheets 22 as viewed in plan, and the gate interconnect 33 overlaps the nanosheets 23a and 23b as viewed in plan. The gate interconnect 36 overlaps the nanosheets 26a and 26b as viewed in plan, the gate interconnect 37 overlaps the nanosheets 27 as viewed in plan, the gate interconnect 39a overlaps the nanosheets 28 as viewed in plan, and the gate interconnect 39b overlaps the nanosheets 25 as viewed in plan.

In FIGS. 14A-14B, the gate interconnect 30a is to be the gate of the access transistor PG4, the gate interconnect 30b is to be the gate of the access transistor PG3, the gate interconnect 32 is to be the gate of the load transistor PU2, the gate interconnect 33 is to be the gates of the transistors PD21 and PD22, the gate interconnect 36 is to be the gates of the transistors PD11 and PD12, the gate interconnect 37 is to be the gate of the load transistor PU1, the gate interconnect 39a is to be the gate of the access transistor PG2, and the gate interconnect 39b is to be the gate of the access transistor PG1.

The gate interconnects 30a and 30b are mutually connected through a bridge 114, and the gate interconnects 39a and 39b are mutually connected through a bridge 115. Also, the gate interconnect 30a is connected with the interconnect 71h through the contact 82a, and the gate interconnect 39b is connected with the interconnect 71k through the contact 82d.

In FIGS. 14A-14B, the right side faces of the nanosheets 24, 22, 23b, 26b, and 28 in the figure are exposed, not covered with the gate interconnects 30a, 32, 33, 36, and 39a, respectively. The left side faces of the nanosheets 21,23a, 26a, 27, and 25 in the figure are exposed, not covered with the gate interconnects 30b, 33, 36, 37, and 39b, respectively.

That is, the faces of the nanosheets 24 and 21 opposed to each other in the X direction are exposed from the gate interconnects 30a and 30b, respectively. The faces of the nanosheets 22 and 23a opposed to each other in the X direction are exposed from the gate interconnects 32 and 33, respectively. The faces of the nanosheets 26b and 27 opposed to each other in the X direction are exposed from the gate interconnects 36 and 37, respectively. The faces of the nanosheets 28 and 25 opposed to each other in the X direction are exposed from the gate interconnects 39a and 39b, respectively.

According to the layout structure of FIGS. 14A-14B, the faces of the nanosheets 24 and 21 opposed to each other in the X direction are exposed from the gate interconnects 30a and 30b, the faces of the nanosheets 22 and 23a opposed to each other in the X direction are exposed from the gate interconnects 32 and 33, the faces of the nanosheets 26b and 27 opposed to each other in the X direction are exposed from the gate interconnects 36 and 37, and the faces of the nanosheets 28 and 25 opposed to each other in the X direction are exposed from the gate interconnects 39a and 39b. This can reduce the distance d1 between the access transistors PG4 and PG3, between the load transistor PU2 and the transistor PD21, between the transistor PD12 and the load transistor PU1, and between the access transistors PG2 and PG1, in the X direction, whereby reduction in the area of the semiconductor storage device can be achieved.

Also, since the spacing between the first bit line BLA and the second bit line BLAX and the spacing between the third bit line BLB and the fourth bit line BLBX are widened, the coupling capacitance between bit lines is reduced. This prevents noise caused by the inter-bit-line coupling capacitance, and thus permits speedups of write operation and read operation into and from the two-port SRAM cell.

Also, similar effects to those obtained in the configuration of FIGS. 12A-12B can be obtained.

Note that a shield interconnect (an interconnect connected to VDD or VSS) extending in the Y direction may be placed between the interconnects 71g and 71e and between the interconnects 71f and 71d.

Alteration 3

FIGS. 15A-15B are plan views showing yet another example of the layout structure of the two-port SRAM cell according to the second embodiment. Specifically, FIG. 15A shows an upper part of the cell, and FIG. 15B shows a lower part of the cell. In FIGS. 15A-15B, in comparison with FIGS. 14A-14B, the placement of the access transistors PG2 and PG3 and the interconnects 71b, 71c, 71e, and 71f is different. Specifically, the access transistor PG2 is displaced leftward from the position in FIGS. 14A-14B, and the access transistor PG3 is displaced rightward from the position in FIGS. 14A-14B. Also, the interconnect 71b is placed between the interconnects 71g and 71e, and the interconnect 71c is placed between the interconnects 71f and 71d.

As shown in FIG. 15B, the nanosheets 21 are formed on the upper side of the pad 404b in the figure and connected with the pad 404b. The nanosheets 28 are formed on the lower side of the pad 407a in the figure and connected with the pad 407a. The pad 401 is formed on the upper side of the nanosheets 21 in the figure. The pad 410 is formed on the lower side of the nanosheets 28 in the figure.

In FIGS. 15A-15B, the nanosheets 21 and 26b are formed side by side in the Y direction, and the nanosheets 23a and 28 are formed side by side in the Y direction.

The gate interconnect 30b is formed so that its right end is at the same position as the right end of the gate interconnect 36 in the X direction, as viewed in the figure. The gate interconnect 39a is formed so that its left end is at the same position as the left end of the gate interconnect 33 in the X direction, as viewed in the figure. The gate interconnects 31 and 38 are omitted.

In FIGS. 15A-15B, the access transistor PG3 is constituted by the nanosheets 21, the gate interconnect 30b, and the pads 401 and 404b. The access transistor PG2 is constituted by the nanosheets 28, the gate interconnect 39a, and the pads 407a and 410.

As shown in FIG. 15A, the interconnect 71b supplying VSS is placed between the interconnect 71g that is the fourth bit line BLBX and the interconnect 71e that is the third bit line BLB. The interconnect 71c supplying VSS is placed between the interconnect 71f that is the second bit line BLAX and the interconnect 71d that is the first bit line BLA.

In FIGS. 15A-15B, the right side faces of the nanosheets 21 in the figure are exposed, not covered with the gate interconnect 30b. The left side faces of the nanosheets 28 in the figure are exposed, not covered with the gate interconnect 39a.

According to the layout structure of FIGS. 15A-15B, since a VSS line is interposed between the first bit line BLA and the second bit line BLAX and between the third bit line BLB and the fourth bit line BLBX, the coupling capacitance between bit lines is reduced. This prevents noise caused by the inter-bit-line coupling capacitance, and thus permits speedups of write operation and read operation into and from the two-port SRAM cell.

Also, similar effects to those obtained in the configuration of FIGS. 14A-14B can be obtained.

Third Embodiment

Figures 16A, 16B:
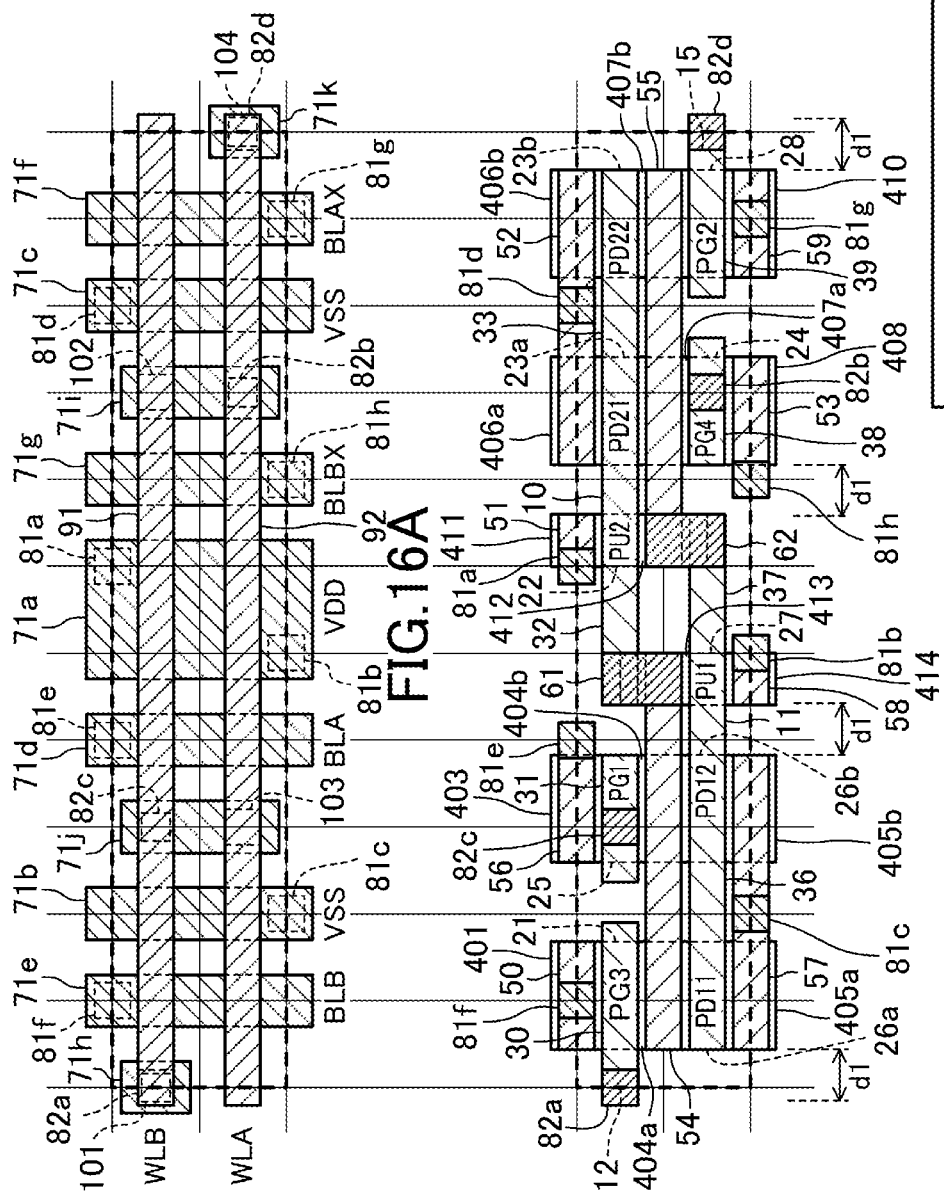
FIGS. 16A-16B are plan views showing an example of the layout structure of a two-port SRAM cell according to the third embodiment.

FIGS. 16A-16B are plan views showing an example of the layout structure of a two-port SRAM cell according to the third embodiment. Specifically, FIG. 16A shows an upper part of the cell, and FIG. 16B shows a lower part of the cell. In FIGS. 16A-16B, the two-port SRAM cell circuit of FIG. 4 is constituted by the load transistors PU1 and PU2, the drive transistor PD1 (transistors PD11 and PD12), the drive transistor PD2 (transistors PD21 and PD22), and the access transistors PG1 to PG4. A two-port SRAM cell inverted in the X direction is placed on each of the left and right sides of the two-port SRAM cell of FIGS. 16A-16B.

As shown in FIG. 16B, the nanosheets 21, 25, 22, 23a, and 23b are arranged in this order in the X direction, and the nanosheets 26a, 26b, 27, 24, and 28 are arranged in this order in the X direction. The nanosheets 21 and 26a are formed side by side in the Y direction, the nanosheets 25 and 26 are formed side by side in the Y direction, the nanosheets 23a and 24 are formed side by side in the Y direction, and the nanosheets 23b and 28 are formed side by side in the Y direction.

The gate interconnect 30 overlaps the nanosheets 21 as viewed in plan, the gate interconnect 31 overlaps the nanosheets 25 as viewed in plan, the gate interconnect 32 overlaps the nanosheets 22 as viewed in plan, and the gate interconnect 33 overlaps the nanosheets 23a and 23b as viewed in plan. The gate interconnect 36 overlaps the nanosheets 26a and 26b as viewed in plan, the gate interconnect 37 overlaps the nanosheets 27 as viewed in plan, the gate interconnect 38 overlaps the nanosheets 24 as viewed in plan, and the gate interconnect 39 overlaps the nanosheets 28 as viewed in plan.

The gate interconnect 30 is connected with a gate interconnect 30 of a two-port SRAM cell placed on the left side of the subject two-port SRAM cell in the figure through the bridge 12. The gate interconnects 32 and 33 are mutually connected through the bridge 10. The gate interconnects 36 and 37 are mutually connected through the bridge 11. The gate interconnect 39 is connected with a gate interconnect 39 of a two-port SRAM cell placed on the right side of the subject two-port SRAM cell in the figure through the bridge 15.

In FIGS. 16A-16B, the access transistor PG3 is constituted by the nanosheets 21, the gate interconnect 30, and the pads 401 and 404a. The access transistor PG1 is constituted by the nanosheets 25, the gate interconnect 31, and the pads 403 and 404b. The load transistor PU2 is constituted by the nanosheets 22, the gate interconnect 32, and the pads 411 and 412. The transistor PD21 is constituted by the nanosheets 23a, the gate interconnect 33, and the pads 406a and 407a. The transistor PD22 is constituted by the nanosheets 23b, the gate interconnect 33, and the pads 406b and 407b. The transistor PD11 is constituted by the nanosheets 26a, the gate interconnect 36, and the pads 404a and 405a. The transistor PD12 is constituted by the nanosheets 26b, the gate interconnect 36, and the pads 404b and 405b. The load transistor PU1 is constituted by the nanosheets 27, the gate interconnect 37, and the pads 413 and 414. The access transistor PG4 is constituted by the nanosheets 24, the gate interconnect 38, and the pads 407a and 408. The access transistor PG2 is constituted by the nanosheets 28, the gate interconnect 39, and the pads 407b and 410.

Thus, the access transistors PG3 and PG1, the load transistor PU2, and the transistors PD21 and PD22 are formed in line in the X direction. The transistors PD11 and PD12, the load transistor PU1, and the access transistors PG4 and PG2 are formed in line in the X direction. Also, the access transistor PG3 and the transistor PD11 are formed side by side in the Y direction, and the access transistor PG1 and the transistor PD12 are formed side by side in the Y direction. The transistor PD21 and the access transistor PG4 are formed side by side in the Y direction, and the transistor PD22 and the access transistor PG2 are formed side by side in the Y direction.

As shown in FIG. 16A, the interconnect 71d that is the first bit line BLA and the interconnect 71e that is the third bit line BLB are placed away from each other in the X direction, with the interconnect 71b supplying VSS interposed between them. The interconnect 71f that is the second bit line BLAX and the interconnect 71g that is the fourth bit line BLBX are placed away from each other in the X direction, with the interconnect 71c supplying VSS interposed between them.

Also, the interconnect 71j, formed to extend in the Y direction, is placed between the interconnects 71b and 71d. The interconnect 71i, formed to extend in the Y direction, is placed between the interconnects 71g and 71c. The interconnects 71j and 71i are connected to the gate interconnects 31 and 38 through the contacts 82c and 82b, respectively.

In FIGS. 16A-16B, the right side faces of the nanosheets 25, 22, 23b, 26b, and 28 are exposed, not covered with the gate interconnects 31, 32, 33, 36, and 39, respectively. The left side faces of the nanosheets 21, 23a, 26a, 27, and 24 are exposed, not covered with the gate interconnects 30, 33, 36, 37, and 38, respectively.

That is, the faces of the nanosheets 22 and 23a opposed to each other in the X direction are exposed from the gate interconnects 32 and 33, respectively. The faces of the nanosheets 26b and 27 opposed to each other in the X direction are exposed from the gate interconnects 36 and 37, respectively.

The nanosheets 21 and 26a are formed close to the cell boundary on the left side in the figure, and the nanosheets 23b and 28 are formed close to the cell boundary on the right side in the figure. A two-port SRAM cell inverted in the X direction is placed on each of the left and right sides of the two-port SRAM cell of FIGS. 16A-16B. That is, in the two-port SRAM cells arranged in the X direction, the faces of the nanosheets 21 of the adjacent cells opposed to each other in the X direction are exposed from the gate interconnects 30. The faces of the nanosheets 23b of the adjacent cells opposed to each other in the X direction are exposed from the gate interconnects 33. The faces of the nanosheets 26a of the adjacent cells opposed to each other in the X direction are exposed from the gate interconnects 36. The faces of the nanosheets 28 of the adjacent cells opposed to each other in the X direction are exposed from the gate interconnects 39.

With the above configuration, the faces of the nanosheets 22 and 23a opposed to each other in the X direction are exposed from the gate interconnects 32 and 33, and the faces of the nanosheets 26b and 27 opposed to each other in the X direction are exposed from the gate interconnects 36 and 37. This can reduce the distance d1 between the load transistor PU2 and the transistor PD21 and between the transistor PD12 and the load transistor PU1, in the X direction, whereby reduction in the area of the semiconductor storage device can be achieved.

Also, in two-port SRAM cells arranged in the X direction, the faces of the nanosheets 21 of the adjacent cells opposed to each other in the X direction are exposed from the gate interconnects 30, the faces of the nanosheets 23b of the adjacent cells opposed to each other in the X direction are exposed from the gate interconnects 33, the faces of the nanosheets 26a of the adjacent cells opposed to each other in the X direction are exposed from the gate interconnects 36, and the faces of the nanosheets 28 of the adjacent cells opposed to each other in the X direction are exposed from the gate interconnects 39. This can reduce the distance d1 between the adjacent access transistors PG3, between the adjacent transistors PD22, between the adjacent transistors PD11, and between the adjacent access transistors PG2, in the X direction, whereby reduction in the area of the semiconductor storage device can be achieved.

Moreover, the access transistor PG3 and the transistor PD11 are formed side by side in the Y direction, the access transistor PG1 and the transistor PD12 are formed side by side in the Y direction, the transistor PD21 and the access transistor PG4 are formed side by side in the Y direction, and the transistor PD22 and the access transistor PG2 are formed side by side in the Y direction. This can reduce the area of the semiconductor storage device.

Further, the spacing between the first bit line BLA and the third bit line BLB and the spacing between the second bit line BLAX and the fourth bit line BLBX are widened, and a VSS line is interposed in each spacing. This reduces the coupling capacitance between bit lines, and thus prevents noise caused by the inter-bit-line coupling capacitance. It is therefore possible to speed up write operation and read operation into and from the two-port SRAM cell.

Alteration 1

Figures 17A, 17B:
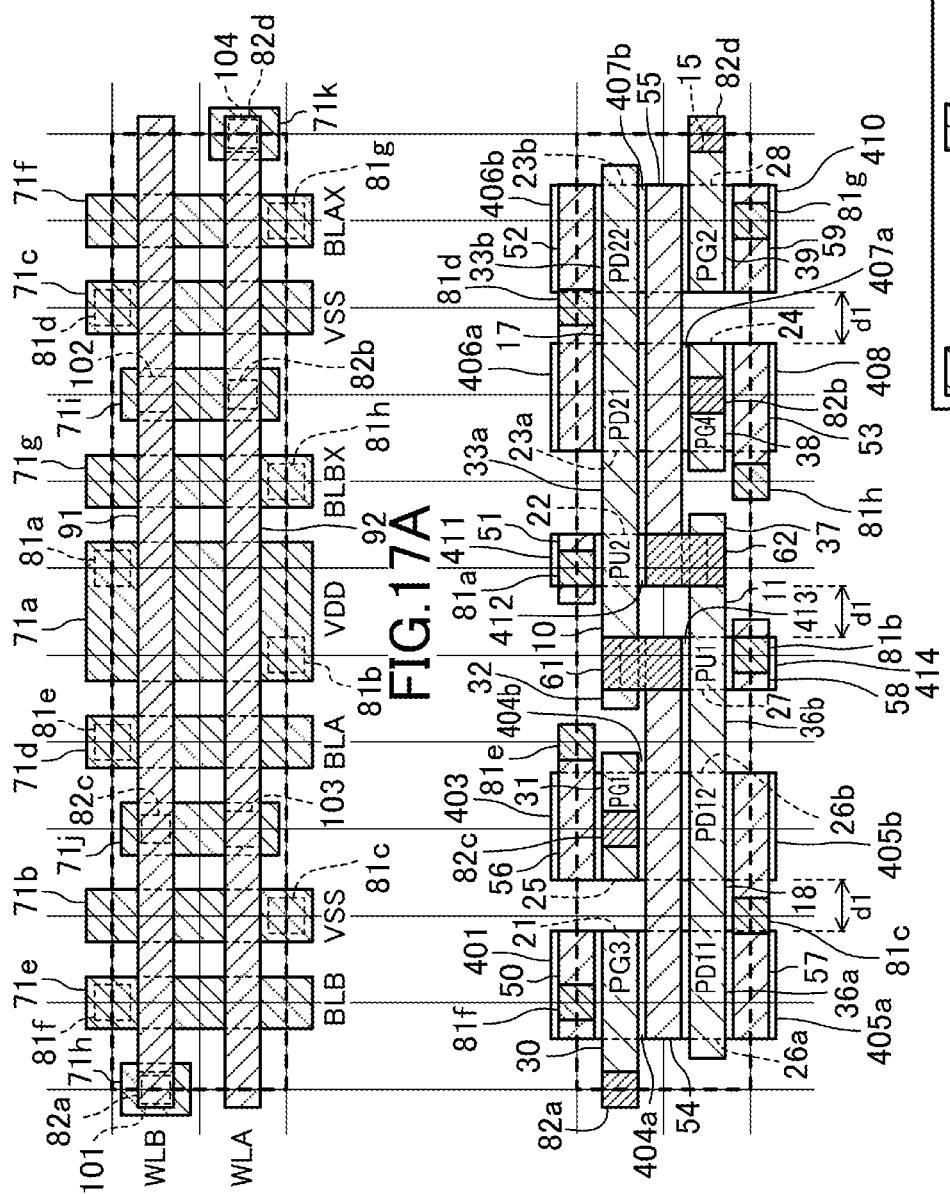
FIGS. 17A-17B are plan views showing another example of the layout structure of the two-port SRAM cell according to the third embodiment.

FIGS. 17A-17B are plan views showing another example of the layout structure of the two-port SRAM cell according to the third embodiment. Specifically, FIG. 17A shows an upper part of the cell, and FIG. 17B shows a lower part of the cell. In FIGS. 17A-17B, in comparison with FIGS. 16A-16B, the faces of the nanosheets opposite to the faces in the case of FIGS. 16A-16B in the X direction are exposed from the gate interconnects.

As shown in FIG. 17B, the gate interconnects 33a and 33b extending in the X and Z directions are formed on the right side of the gate interconnect 32 in the figure, and the gate interconnects 36a and 36b extending in the X and Z directions are formed on the left side of the gate interconnect 37 in the figure.

The gate interconnect 33a overlaps the nanosheets 22 and 23a as viewed in plan, and the gate interconnect 33b overlaps the nanosheets 23b as viewed in plan. The gate interconnect 36a overlaps the nanosheets 26a as viewed in plan, and the gate interconnect 36b overlaps the nanosheets 26b and 27 as viewed in plan.

In FIGS. 17A-17B, the gate interconnect 33a is to be the gates of the load transistor PU2 and the transistor PD21, and the gate interconnect 33b is to be the gate of the transistor PD22. The gate interconnect 36a is to be the gate of the transistor PD11, and the gate interconnect 36b is to be the gates of the transistor PD12 and the load transistor PU1.

The gate interconnects 32 and 33a are mutually connected through the bridge 10, the gate interconnects 33a and 33b are mutually connected through the bridge 17, the gate interconnects 36a and 36b are mutually connected through the bridge 18, and the gate interconnects 36b and 37 are mutually connected through the bridge 11. Also, the gate interconnect 30 is connected with the interconnect 71h through the contact 82a, and the gate interconnect 39 is connected with the interconnect 71k through the contact 82d.

In FIGS. 17A-17B, the left side faces of the nanosheets 25, 22, 23b, 26b, and 28 are exposed, not covered with the gate interconnects 31, 33a, 33b, 36b, and 39, respectively. The right side faces of the nanosheets 21, 23a, 26a, 27, and 24 are exposed, not covered with the gate interconnects 30, 33a, 36a, 36b, and 38, respectively.

That is, the faces of the nanosheets 21 and 25 opposed to each other in the X direction are exposed from the gate interconnects 30 and 31, respectively. The faces of the nanosheets 23a and 23b opposed to each other in the X direction are exposed from the gate interconnects 33a and 33b, respectively. The faces of the nanosheets 26a and 26b opposed to each other in the X direction are exposed from the gate interconnects 36a and 36b, respectively. The faces of the nanosheets 24 and 28 opposed to each other in the X direction are exposed from the gate interconnects 38 and 39, respectively.

Also, the nanosheets 22 are formed at the upper right of the nanosheets 27 as viewed in plan. That is, the faces of the nanosheets 22 and 27 opposed to each other in the X direction are exposed from the gate interconnects 33a and 36b, respectively.

According to the layout structure of FIGS. 17A-17B, the faces of the nanosheets 21 and 25 opposed to each other in the X direction are exposed from the gate interconnects 30 and 31, the faces of the nanosheets 23a and 23b opposed to each other in the X direction are exposed from the gate interconnects 33a and 33b, the faces of the nanosheets 26a and 26b opposed to each other in the X direction are exposed from the gate interconnects 36a and 36b, and the faces of the nanosheets 24 and 28 opposed to each other in the X direction are exposed from the gate interconnects 38 and 39. This can reduce the distance d1 between the access transistors PG3 and PG1, between the transistors PD21 and PD22, between the transistors PD11 and PD12, and between the access transistors PG4 and PG2, in the X direction, whereby reduction in the area of the semiconductor storage device can be achieved.

Also, the faces of the nanosheets 22 and 27 opposed to each other in the X direction are exposed from the gate interconnects 33a and 36b. This can reduce the distance d1 between the load transistors PU1 and PU2 in the X direction, whereby reduction in the area of the semiconductor storage device can be achieved.

Also, similar effects to those obtained in the configuration of FIGS. 16A-16B can be obtained.

In the embodiments and alterations described above, while each transistor includes three nanosheets, some or all transistors may include one nanosheet, two nanosheets, or four or more nanosheets.

While the cross-sectional shape of the nanosheets is illustrated as rectangular in the above embodiments, it is not limited to this. For example, the shape may be square, circular, or oval.

According to the present disclosure, a two-port SRAM cell using forksheet transistors can be implemented, and also reduction in the area of a semiconductor storage device can be achieved.

What is claimed is:

1. A semiconductor storage device including a two-port SRAM cell, the two-port SRAM cell comprising:
    a first transistor connected to a first power supply supplying a first voltage at one of its nodes, to a first node at the other node, and to a second node at its gate;
    a second transistor connected to the first power supply at one of its nodes, to the second node at the other node, and to the first node at its gate;
    a third transistor connected to a first bit line at one of its nodes, to the first node at the other node, and to a first word line at its gate;
    a fourth transistor connected to a second bit line at one of its nodes, to the second node at the other node, and to the first word line at its gate, the first bit line and the second bit line constituting a first complementary bit line pair;
    a fifth transistor connected to a third bit line at one of its nodes, to the first node at the other node, and to a second word line at its gate;
    a sixth transistor connected to a fourth bit line at one of its nodes, to the second node at the other node, and to the second word line at its gate, the third bit line and the fourth bit line constituting a second complementary bit line pair;
    a seventh transistor connected to the first node at one of its nodes, to a second power supply supplying a second voltage different from the first voltage at the other node, and to the second node at its gate; and
    an eighth transistor connected to the second node at one of its nodes, to the second power supply at the other node, and to the first node at its gate,
  wherein
    the first to sixth transistors respectively include:
      first to sixth nanosheets extending in a first direction, and
      first to sixth gate interconnects surrounding the first to sixth nanosheets, respectively, in a second direction vertical to the first direction and in a third direction perpendicular to the first and second directions,
    the seventh transistor includes:
      seventh and eighth nanosheets extending in the first direction, and
      seventh and eighth gate interconnects surrounding the seventh and eighth nanosheets, respectively, in the second and third directions,
    the eighth transistor includes:
      ninth and tenth nanosheets extending in the first direction, and ninth and tenth gate interconnects surrounding the ninth and tenth nanosheets, respectively, in the second and third directions, the sixth, fifth, second, ninth, and tenth nanosheets are formed in line in this order in the second direction, the seventh, eighth, first, fourth, and third nanosheets are formed in line in this order in the second direction, faces of the second, sixth, eighth, and tenth nanosheets on a first side as one of the opposite sides in the second direction are exposed from the second, sixth, eighth, and tenth gate interconnects, respectively, faces of the first, third, seventh, and ninth nanosheets on a second side as the other side in the second direction are exposed from the first, third, seventh, and ninth gate interconnects, respectively, a face of the fourth nanosheet on either the first or second side is exposed from the fourth gate interconnect, and a face of the fifth nanosheet on either the first or second side is exposed from the fifth gate interconnect.

2. The semiconductor storage device of claim 1, wherein the third nanosheet is formed close to a cell boundary of the two-port SRAM cell on the second side, the sixth nanosheet is formed close to a cell boundary of the two-port SRAM cell on the first side, the first side is the side on which the tenth nanosheet is opposed to the ninth nanosheet and the side on which the eighth nanosheet is opposed to the seventh nanosheet, and the second side is the side on which the ninth nanosheet is opposed to the tenth nanosheet and the side on which the seventh nanosheet is opposed to the eighth nanosheet.

3. The semiconductor storage device of claim 2, wherein the fifth and seventh nanosheets are formed side by side in the first direction, the fourth and tenth nanosheets are formed side by side in the first direction, a face of the fourth nanosheet on the first side is exposed from the fourth gate interconnect, and a face of the fifth nanosheet on the second side is exposed from the fifth gate interconnect.

4. The semiconductor storage device of claim 2, wherein the fifth and eighth nanosheets are formed side by side in the first direction, the fourth and ninth nanosheets are formed side by side in the first direction, a face of the fourth nanosheet on the second side is exposed from the fourth gate interconnect, and a face of the fifth nanosheet on the first side is exposed from the fifth gate interconnect.

5. The semiconductor storage device of claim 1, wherein the first side is the side on which the second nanosheet is opposed to the ninth nanosheet, and the side on which the eight nanosheet is opposed to the first nanosheet, and the second side is the side on which the ninth nanosheet is opposed to the second nanosheet, and the side on which the first nanosheet is opposed to the eighth nanosheet.

6. The semiconductor storage device of claim 5, wherein the fifth and seventh nanosheets are formed side by side in the first direction, the fourth and tenth nanosheets are formed side by side in the first direction, a face of the fourth nanosheet on the first side is exposed from the fourth gate interconnect, a face of the fifth nanosheet on the second side is exposed from the fifth gate interconnect, the first side is the side on which the sixth nanosheet is opposed to the fifth nanosheet, and the side on which the fourth nanosheet is opposed to the third nanosheet, and the second side is the side on which the fifth nanosheet is opposed to the sixth nanosheet, and the side on which the third nanosheet is opposed to the fourth nanosheet.

7. The semiconductor storage device of claim 5, wherein the fifth and eighth nanosheets are formed side by side in the first direction, the fourth and ninth nanosheets are formed side by side in the first direction, a face of the fourth nanosheet on the second side is exposed from the fourth gate interconnect, and a face of the fifth nanosheet on the first side is exposed from the fifth gate interconnect.

8. The semiconductor storage device of claim 1, wherein the two-port SRAM cell further comprises:

first and second power lines extending in the first direction and supplying the second voltage;

a first interconnect extending in the first direction, which is to be the first bit line;

a second interconnect extending in the first direction, which is to be the second bit line;

a third interconnect extending in the first direction, which is to be the third bit line; and a fourth interconnect extending in the first direction, which is to be the fourth bit line, the first and second power lines and the first to fourth interconnects are formed in a same interconnect layer above the first to tenth transistors, the first power line is formed between the first interconnect and the second interconnect, and the second power line is formed between the third interconnect and the fourth interconnect.

9. A semiconductor storage device including a two-port SRAM cell, the two-port SRAM cell comprising:

a first transistor connected to a first power supply supplying a first voltage at one of its nodes, to a first node at the other node, and to a second node at its gate;

a second transistor connected to the first power supply at one of its nodes, to the second node at the other node, and to the first node at its gate;

a third transistor connected to a first bit line at one of its nodes, to the first node at the other node, and to a first word line at its gate;

a fourth transistor connected to a second bit line at one of its nodes, to the second node at the other node, and to the first word line at its gate, the first bit line and the second bit line constituting a first complementary bit line pair;

a fifth transistor connected to a third bit line at one of its nodes, to the first node at the other node, and to a second word line at its gate;

a sixth transistor connected to a fourth bit line at one of its nodes, to the second node at the other node, and to the second word line at its gate, the third bit line and the fourth bit line constituting a second complementary bit line pair;

a seventh transistor connected to the first node at one of its nodes, to a second power supply supplying a second voltage different from the first voltage at the other node, and to the second node at its gate; and an eighth transistor connected to the second node at one of its nodes, to the second power supply at the other node, and to the first node at its gate, wherein the first to sixth transistors respectively include:

first to sixth nanosheets extending in a first direction, and first to sixth gate interconnects surrounding the first to sixth nanosheets, respectively, in a second direction vertical to the first direction and in a third direction perpendicular to the first and second directions, the seventh transistor includes:

seventh and eighth nanosheets extending in the first direction, and seventh and eighth gate interconnects surrounding the seventh and eighth nanosheets, respectively, in the second and third directions, the eighth transistor includes:

ninth and tenth nanosheets extending in the first direction, and ninth and tenth gate interconnects surrounding the ninth and tenth nanosheets, respectively, in the second and third directions, the fifth, third, second, ninth, and tenth nanosheets are formed in line in this order in the second direction, the seventh, eighth, first, sixth, and fourth nanosheets are formed in line in this order in the second direction, faces of the first, fifth, sixth, seventh, and ninth nanosheets on a first side as one of the opposite sides in the second direction are exposed from the first, fifth, sixth, seventh, and ninth gate interconnects, respectively, and faces of the second, third, fourth, eighth, and tenth nanosheets on a second side as the other side in the second direction are exposed from the second, third, fourth, eighth, and tenth gate interconnects, respectively.

10. The semiconductor storage device of claim 9, wherein the first side is the side on which the ninth nanosheet is opposed to the second nanosheet and the side on which the first nanosheet is opposed to the eighth nanosheet, the second side is the side on which the second nanosheet is opposed to the ninth nanosheet and the side on which the eighth nanosheet is opposed to the first nanosheet, the fifth and seventh nanosheets are formed close to a cell boundary of the two-port SRAM cell on the first side, and the fourth and tenth nanosheets are formed close to a cell boundary of the two-port SRAM cell on the second side.

11. The semiconductor storage device of claim 9, wherein the first side is the side on which the fifth nanosheet is opposed to the third nanosheet and the side on which the ninth nanosheet is opposed to the tenth nanosheet, the side on which the seventh nanosheet is opposed to the eighth nanosheet, and the side on which the sixth nanosheet is opposed to the fourth nanosheet, and the second side is the side on which the third nanosheet is opposed to the fifth nanosheet, the side on which the tenth nanosheet is opposed to the ninth nanosheet, the side on which the eighth nanosheet is opposed to the seventh nanosheet, and the side on which the fourth nanosheet is opposed to the sixth nanosheet.

12. The semiconductor storage device of claim 9, wherein the two-port SRAM cell further comprises:

first and second power lines extending in the first direction and supplying the second voltage;

a first interconnect extending in the first direction, which is to be the first bit line;

a second interconnect extending in the first direction, which is to be the second bit line;

a third interconnect extending in the first direction, which is to be the third bit line; and a fourth interconnect extending in the first direction, which is to be the fourth bit line, the first and second power lines and the first to fourth interconnects are formed in a same interconnect layer above the first to tenth transistors, the first power line is formed between the first interconnect and the third interconnect, and the second power line is formed between the second interconnect and the fourth interconnect.

* * * * *